(12) United States Patent
Lee

(10) Patent No.: US 11,552,102 B2
(45) Date of Patent: Jan. 10, 2023

(54) SEMICONDUCTOR DEVICE AND MANUFACTURING METHOD THEREOF

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 17/387,734

(22) Filed: Jul. 28, 2021

(65) Prior Publication Data

US 2021/0358947 A1 Nov. 18, 2021

Related U.S. Application Data

(62) Division of application No. 16/388,579, filed on Apr. 18, 2019, now Pat. No. 11,114,455.

(30) Foreign Application Priority Data

Sep. 18, 2018 (KR) .......................... 10-2018-0111826

(51) Int. Cl.
| | | |
|---|---|---|
| *H01L 27/11582* | (2017.01) | |
| *H01L 27/11524* | (2017.01) | |
| *H01L 27/11556* | (2017.01) | |
| *H01L 27/11519* | (2017.01) | |
| *H01L 27/11565* | (2017.01) | |
| *H01L 27/24* | (2006.01) | |
| *H01L 27/1157* | (2017.01) | |
| *H01L 45/00* | (2006.01) | |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/249* (2013.01); *H01L 27/2454* (2013.01); *H01L 45/06* (2013.01)

(58) Field of Classification Search
CPC ......... H01L 27/11582; H01L 27/11519; H01L 27/11524; H01L 27/11556; H01L 27/11565; H01L 27/1157; H01L 27/2454; H01L 27/249; H01L 45/06
See application file for complete search history.

(56) References Cited

U.S. PATENT DOCUMENTS

| | | | | |
|---|---|---|---|---|
| 2014/0014889 | A1* | 1/2014 | Shim | ................ H01L 27/11556 257/774 |
| 2014/0097485 | A1* | 4/2014 | Hattori | ................. H01L 29/513 438/591 |
| 2015/0001460 | A1 | 1/2015 | Kim et al. | |
| 2016/0268263 | A1* | 9/2016 | Lee | .................. H01L 27/11507 |
| 2016/0293839 | A1 | 10/2016 | Suzuki et al. | |

FOREIGN PATENT DOCUMENTS

| | | |
|---|---|---|
| KR | 101119875 B1 | 4/2012 |
| KR | 1020170096733 A | 8/2017 |

* cited by examiner

*Primary Examiner* — Mark W Tornow
(74) *Attorney, Agent, or Firm* — William Park & Associates Ltd.

(57) ABSTRACT

A method of manufacturing a semiconductor device includes forming holes passing through a stacked structure, surrounding channel structures, and replacing some of the materials of the stacked structure through the holes.

4 Claims, 19 Drawing Sheets

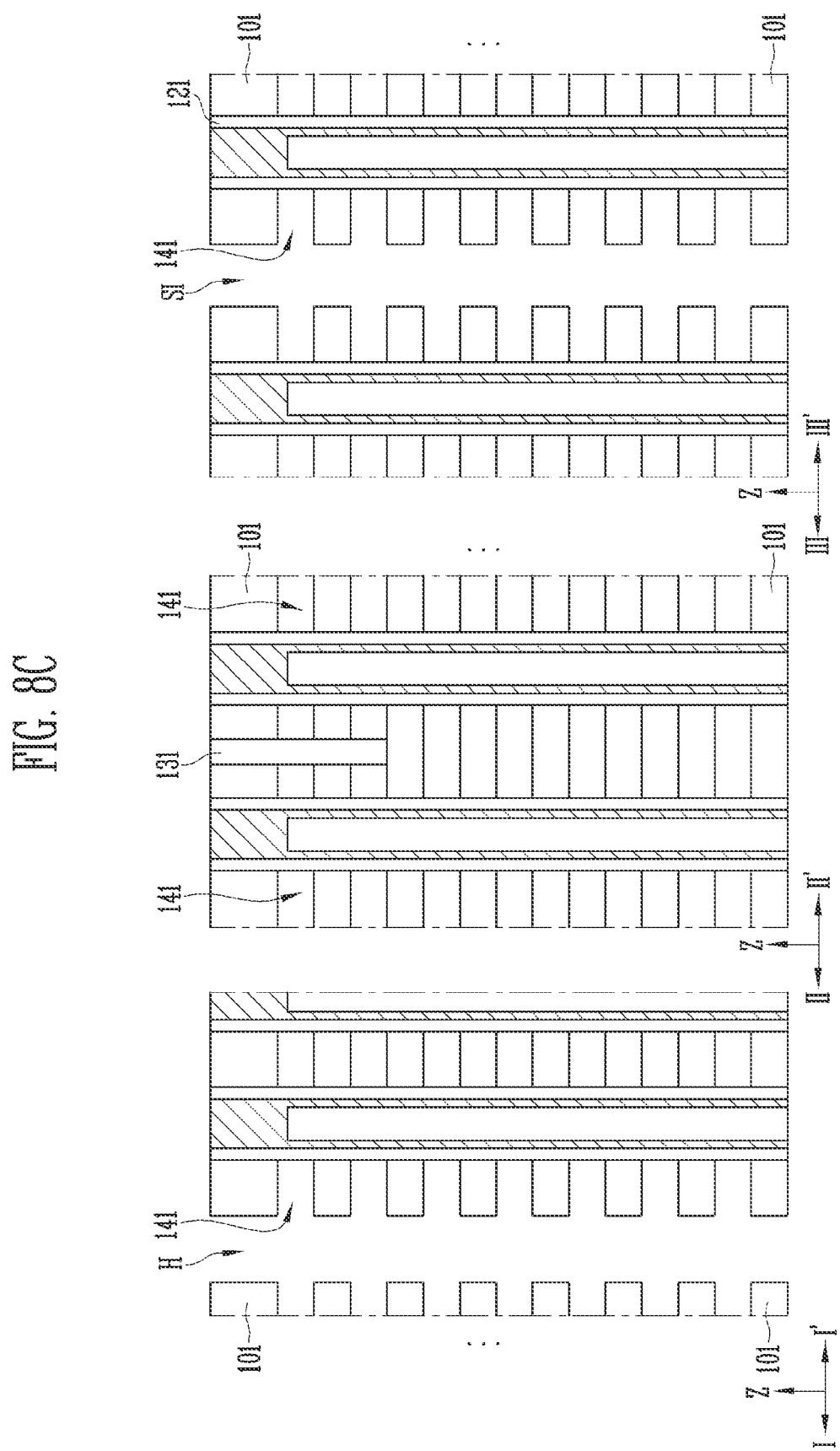

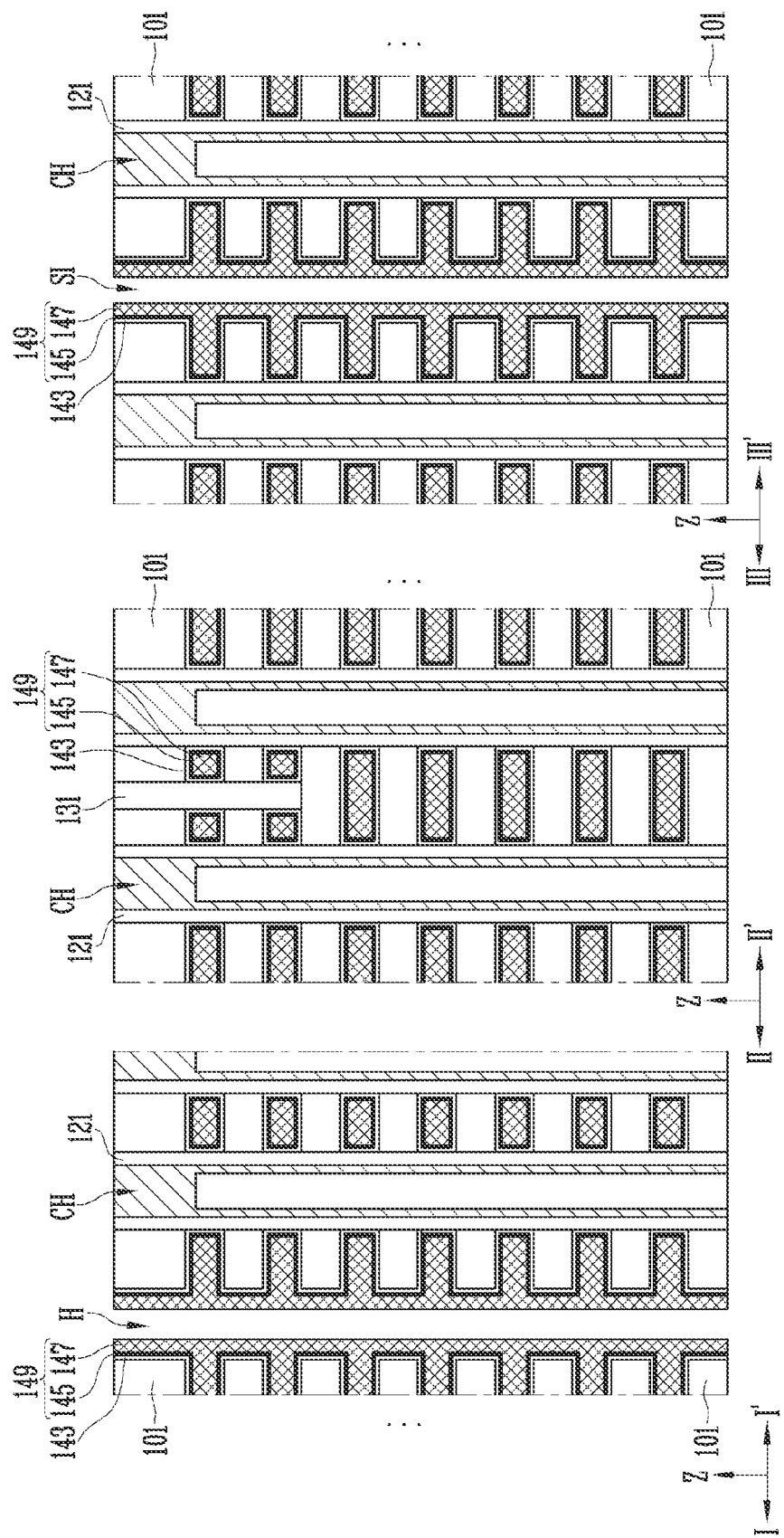

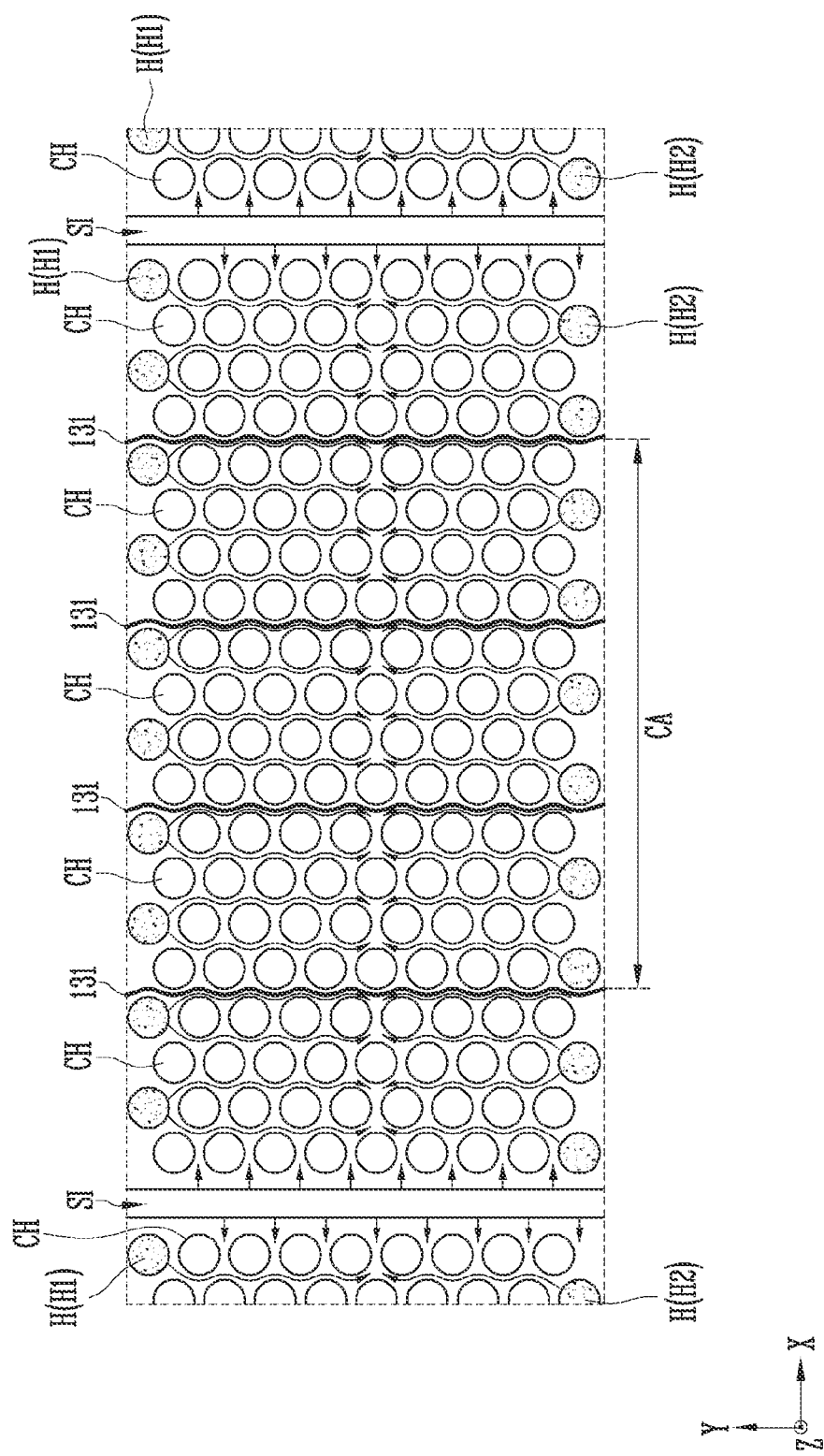

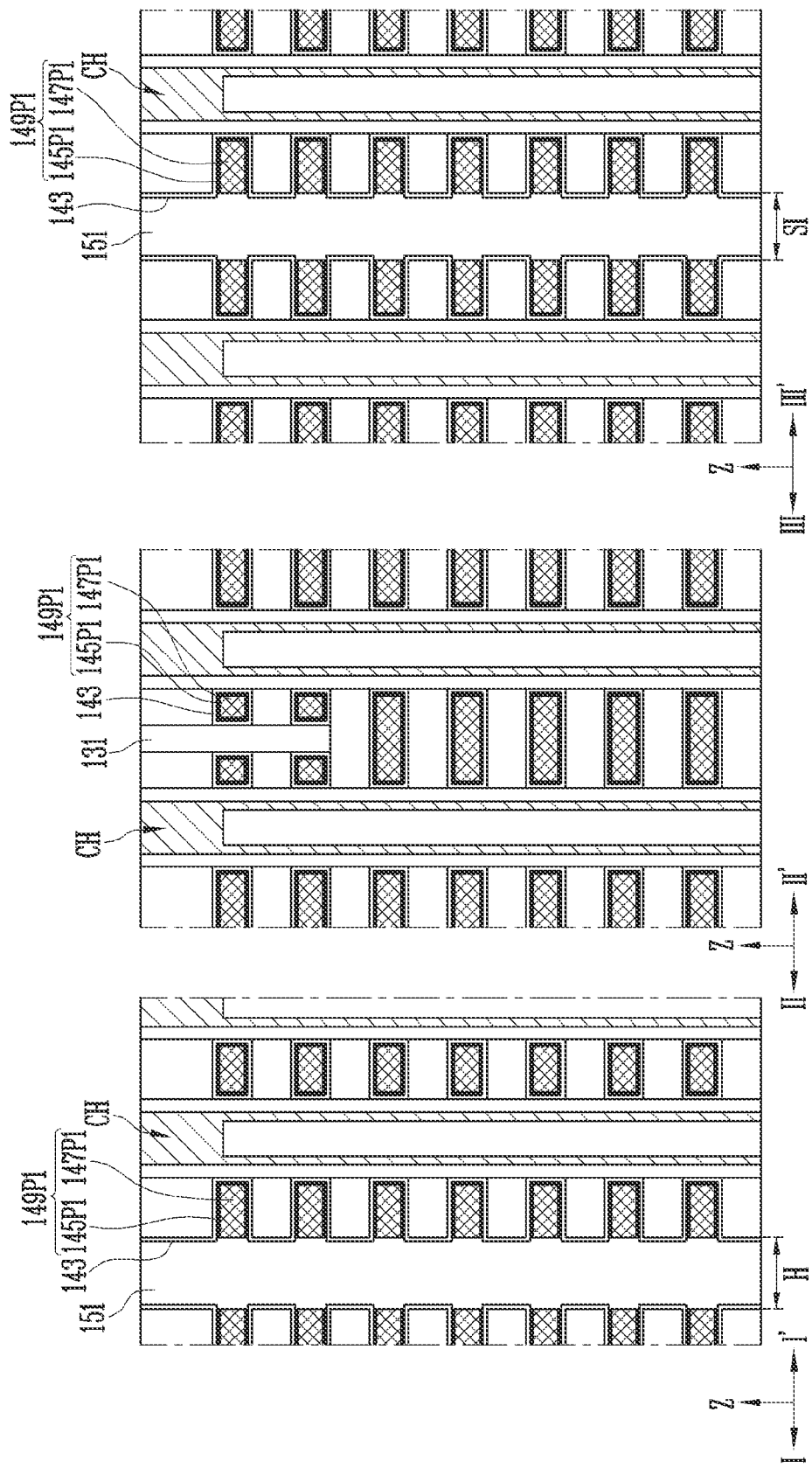

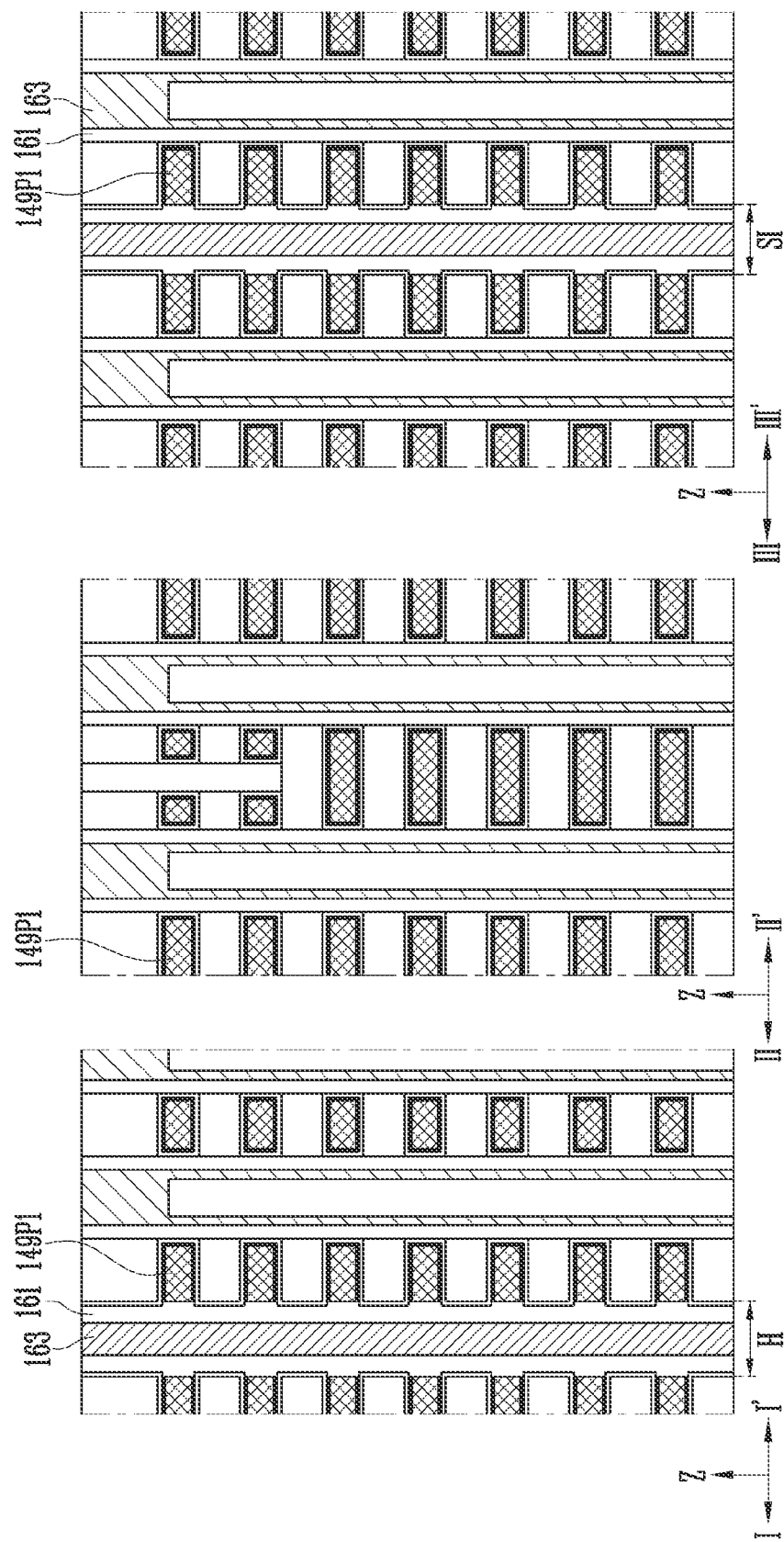

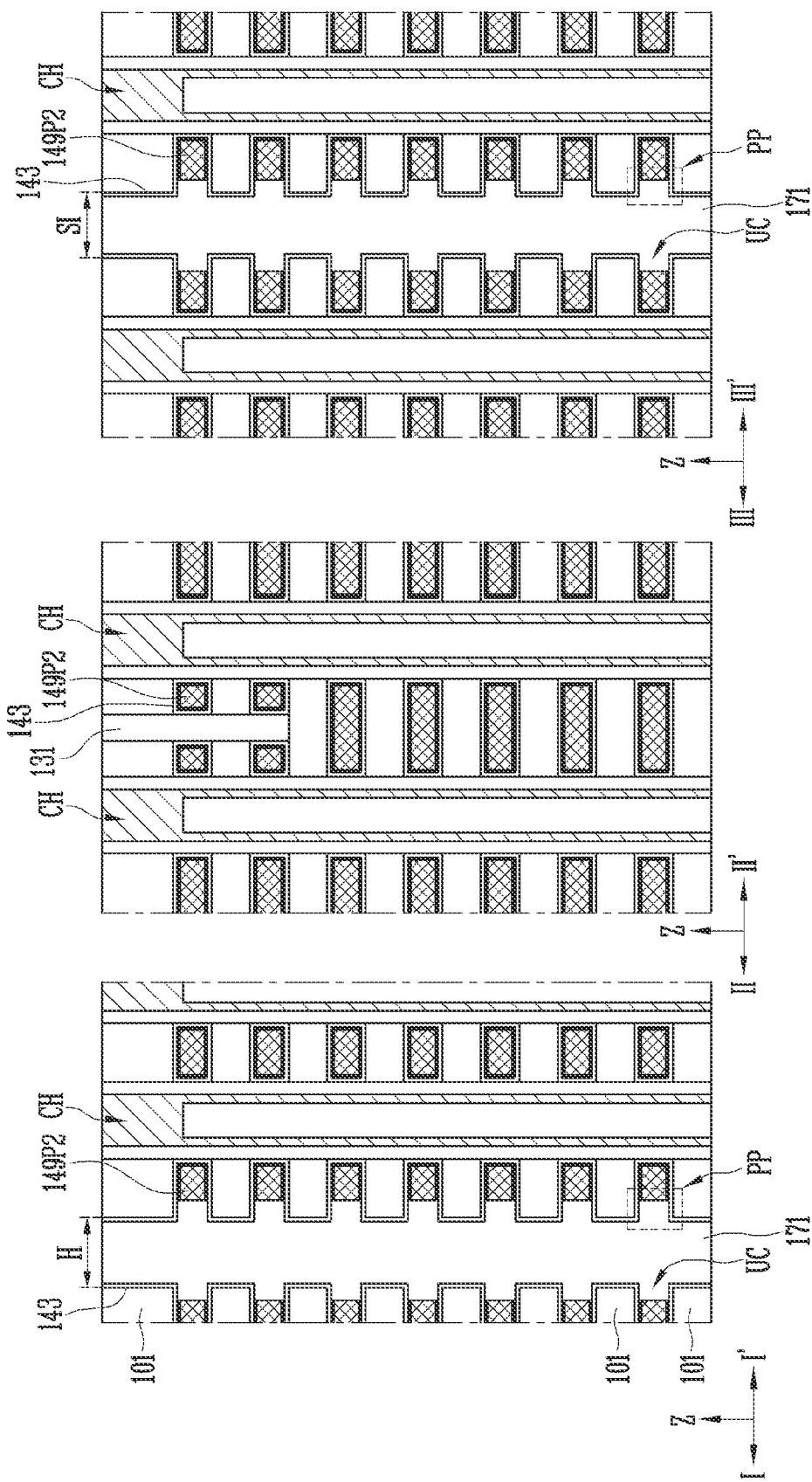

SEMICONDUCTOR DEVICE AND MANUFACTURING METHOD THEREOF

CROSS-REFERENCE TO RELATED APPLICATION

The present application is a divisional application of U.S. patent application Ser. No. 16/388,579, filed on Apr. 18, 2019, and claims priority under 35 U.S.C. § 119(a) to Korean patent application number 10-2018-0111826 filed on Sep. 18, 2018, in the Korean Intellectual Property Office, the entire disclosure of which is incorporated by reference.

BACKGROUND

1. Technical Field

Various embodiments relate generally to a semiconductor device and a manufacturing method thereof, and more particularly, to a three-dimensional semiconductor memory device and a manufacturing method thereof.

2. Related Art

A semiconductor device may include a memory cell array including a plurality of memory cells. The memory cell array may include memory cells arranged in the form of various structures. The memory cells may be arranged in three dimensions on a substrate to improve the integration density of the semiconductor device.

When a three-dimensional semiconductor memory device, including three-dimensionally arranged memory cells, is manufactured, a replace process, in which sacrificial layers, included in a stacked structure, are replaced by different material layers, may be used. However, it may be difficult to replace sacrificial layers with other material layers if the sacrificial layers are arranged in a central area of a memory block.

SUMMARY

According to an embodiment, a method of manufacturing a semiconductor device may include forming a stacked structure, forming channel structures passing through the stacked structure, forming holes passing through the stacked structure, and forming material patterns. The stacked structure may comprise first material layers and second material layers that are alternately stacked in a vertical direction. The material patterns may replace the second material layers through the holes.

According to an embodiment, a semiconductor device may include interlayer insulating layers and conductive patterns that are alternately stacked in a vertical direction. The semiconductor device may include first holes arranged in a first horizontal direction crossing the vertical direction and passing through the interlayer insulating layers and the conductive patterns. The semiconductor device may include second holes arranged in the first horizontal direction and passing through the interlayer insulating layers and the conductive patterns. The semiconductor device may include channel structures arranged between the first holes and the second holes, the channel structures passing through the interlayer insulating layers and the conductive patterns. The semiconductor device may include vertical structures filling the first holes and the second holes. The vertical structures including protruding portions that protrude toward the adjacent conductive patterns.

According to an embodiment, a semiconductor device may include interlayer insulating layers and conductive patterns that are alternately stacked in a vertical direction. The semiconductor device may include first holes arranged in a first horizontal direction crossing the vertical direction and passing through the interlayer insulating layers and the conductive patterns. The semiconductor device may include second holes arranged in the first horizontal direction and passing through the interlayer insulating layers and the conductive patterns. The semiconductor device may include channel structures that are arranged between the first holes and the second holes, the channel structures passing through the interlayer insulating layers and the conductive patterns. The semiconductor device may include a sidewall insulating layer covering a sidewall of each of the first and second holes, and a conductive contact pillar filling each of the first and second holes and formed on the sidewall insulating layer.

BRIEF DESCRIPTION OF THE DRAWINGS

FIGS. 8A to 8D, 9 and 10 are diagrams illustrating a method of manufacturing a semiconductor device according to an embodiment of the present disclosure;

FIGS. 11 to 13 are cross-sectional diagrams illustrating various modifications of processes subsequent to a replace process;

DETAILED DESCRIPTION

Hereinafter, various examples of embodiments will be described, in detail, with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

While terms such as "first" and "second" may be used to describe various components, such components must not be understood as being limited to the above terms. The above terminologies are used to distinguish one component from the other element, for example, a first component may be referred to as a second component without departing from a scope according to the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~between," "immediately ~between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Hereinafter, the present disclosure will be described by explaining examples of embodiments with reference to the accompanying drawings.

Various embodiments of the present disclosure provide a semiconductor device having improved manufacturing process stability and a manufacturing method thereof.

Figure 1A:
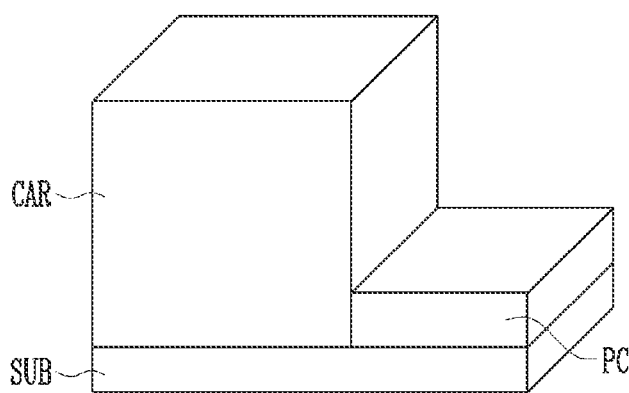
FIGS. 1A and 1B are schematic block diagrams illustrating semiconductor devices according to embodiments of the present disclosure.
Figure 1B:
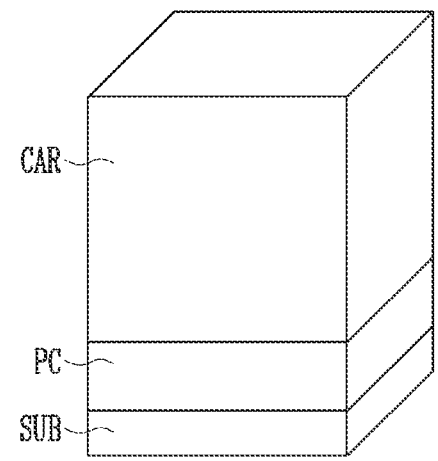

FIGS. 1A and 1B are schematic block diagrams illustrating semiconductor devices according to embodiments of the present disclosure.

Referring to FIGS. 1A and 1B, each of the semiconductor devices according to embodiments of the present disclosure may include a peripheral circuit structure PC and a cell array CAR which are arranged on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include a plurality of memory blocks. Each of the memory blocks may include a plurality of cell strings. Each of the cell strings may be electrically coupled to a bit line, a source line, word lines and select lines. Each of the cell strings may include memory cells and select transistors coupled in series with each other. Each of the select lines may serve as a gate electrode of a corresponding one among the select transistors. Each of the word lines may serve as a gate electrode of a corresponding one among the memory cells.

The peripheral circuit structure PC may include NMOS and PMOS transistors, a resistor, and a capacitor which are electrically coupled to the cell array CAR. The NMOS and PMOS transistors, the resistor, and the capacitor of the peripheral circuit structure PC may serve as elements constituting a row decoder, a column decoder, a page buffer, and a control circuit.

As shown in FIG. 1A, the peripheral circuit structure PC may be arranged on a region of the substrate SUB. The region of the substrate SUB, overlapping the peripheral circuit structure PC, does not overlap with the cell array CAR.

Alternatively, as shown in FIG. 1B, the peripheral circuit structure PC may be arranged between the cell array CAR and the substrate SUB. Since the peripheral circuit structure PC overlaps the cell array CAR, an area on the substrate SUB occupied by the cell array CAR and the peripheral circuit structure PC may be reduced.

Figure 2:
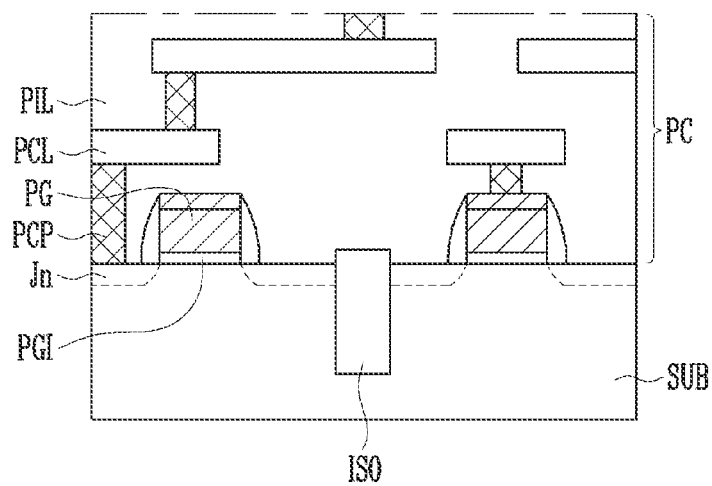
FIG. 2 is a schematic cross-sectional diagram illustrating a peripheral circuit structure.

FIG. 2 is a schematic cross-sectional diagram illustrating the peripheral circuit structure PC. The peripheral circuit structure PC as shown in FIG. 2 may form the peripheral circuit structure PC as shown in FIG. 1A or the peripheral circuit structure PC as shown in FIG. 1B.

Referring to FIG. 2, the peripheral circuit structure PC may include peripheral gate electrodes PG, a peripheral gate insulating layer PGI, junctions Jn, peripheral circuit lines PCL, peripheral contact plugs PCP and a peripheral circuit insulating layer PIL.

Each of the peripheral gate electrodes PG may serve as a gate electrode of an NMOS transistor or a PMOS transistor of the peripheral circuit structure PC. The peripheral gate insulating layer PGI may be arranged between each of the peripheral gate electrodes PG and the substrate SUB.

The junctions Jn may be defined by injecting n-type or p-type impurities into an active region of the substrate SUB. The junctions Jn may be located at both sides of each of the peripheral gate electrodes PG, and may serve as a source junction or a drain junction. The active region of the substrate SUB may be divided by an isolation layer ISO formed in the substrate SUB. The isolation layer ISO may include an insulating material.

The peripheral circuit lines PCL may be electrically coupled to a circuit of the peripheral circuit structure PC through the peripheral contact plugs PCP.

The peripheral circuit insulating layer PIL may cover circuitry of the peripheral circuit structure PC, the peripheral circuit lines PCL and the peripheral contact plugs PCP. The peripheral circuit insulating layer PIL may include a plurality of insulating layers stacked on top of each other.

Figure 3:
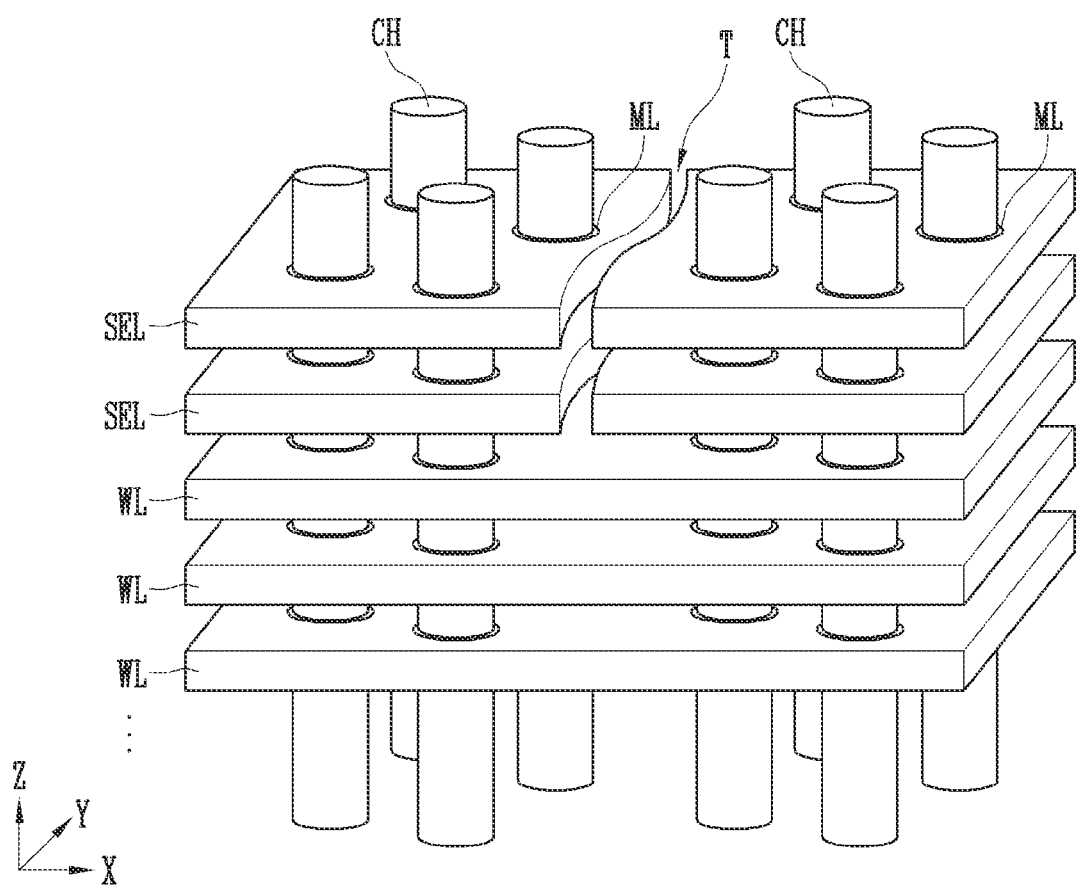
FIG. 3 is a schematic perspective view illustrating a cell array.

FIG. 3 is a schematic perspective view, illustrating a cell array. The cell array, shown in FIG. 3, may be included in the cell array CAR shown in FIG. 1A or the cell array CAR shown in FIG. 1B.

Referring to FIG. 3, the cell array, according to an embodiment of the present disclosure, may include conductive patterns (WL and SEL), stacked separately from each other in a vertical direction Z. Each of the conductive patterns WL and SEL may extend in a first horizontal direction X crossing the vertical direction Z and a second horizontal direction Y. The first horizontal direction X and the second horizontal direction Y may cross each other.

The conductive patterns WL and SEL may include word lines WL and select lines SEL. Each of the word lines WL may serve as a gate electrode of a memory cell, and each of the select lines SEL may serve as a gate electrode of a select transistor. The select lines SEL may be arranged over the word lines WL. Although FIG. 3 shows the select lines SEL in two layers, the present disclosure is not limited thereto. For example, a select line, in at least one layer, may be arranged over the word lines WL. More specifically, a select line, located in one layer, may be arranged over the word lines WL, select lines, located in two layers, may be arranged as shown in FIG. 3, or select lines, in three or more layers, may be arranged. Although not shown in FIG. 3, a lower select line, in one layer, may be arranged under the word lines WL or lower select lines, in two or more layers, may be arranged under the word lines WL in accordance with the design of the semiconductor device.

Channel structures CH may pass through each of the conductive patterns WL and SEL. A multilayer film ML including a data storage layer may be arranged between each of the conductive patterns WL and SEL and each of the channel structures CH. As shown in FIG. 3, the multilayer film ML may be formed along a boundary between each of the conductive patterns WL and SEL and the channel structure CH corresponding thereto. However, the invention is not limited thereto. For example, the multilayer film ML may extend in the vertical direction Z along a sidewall of the corresponding channel structure CH. Alternatively, the multilayer ML may extend in the first horizontal direction X and the second horizontal direction Y along an upper surface and a lower surface of each of the conductive patterns WL and SEL.

Neighboring select lines SEL, located on the same plane, may be separated from each other by a trench T. The channel structures CH, passing through each of the word lines WL, may be divided into different groups by the trench T. The channel structures CH, included in the different groups, may be surrounded by different select lines SEL. The channel structures CH included in the same group may pass through the same select line SEL. As shown in FIG. 3, the trench T may be formed in a wavy pattern extending in the second horizontal direction Y. However, the invention is not limited thereto. For example, the trench T may also be formed in a straight pattern extending in the second horizontal direction Y.

Though not shown in FIG. 3, the channel structures CH, passing through the same select line SEL and included in the same group, may be coupled to different bit lines. By selecting one of the select lines SEL and one of the bit lines, a single channel structure may be selected.

Each of the memory blocks of the cell array may have the above-described structure as described with reference to FIG. 3.

Figure 4:
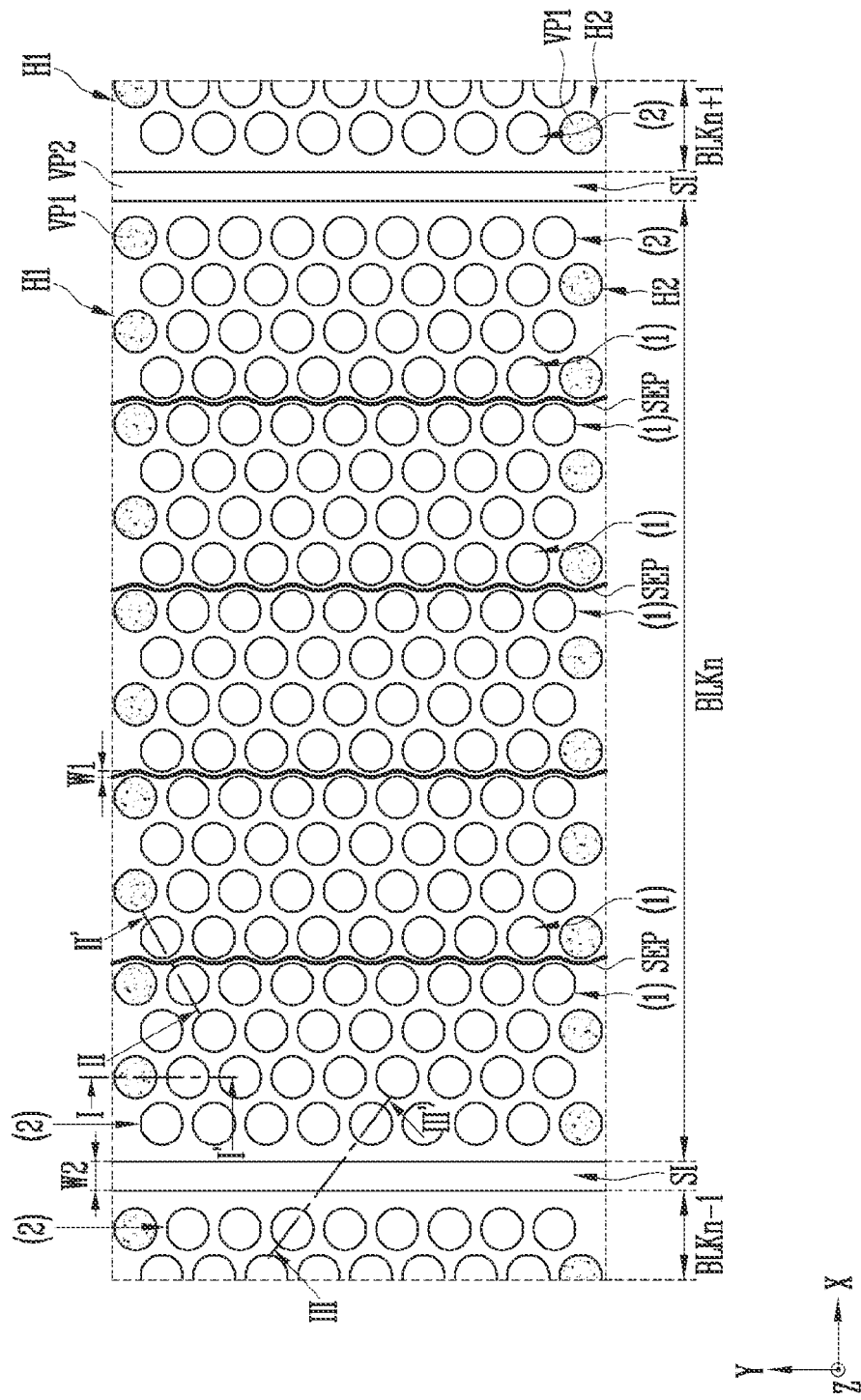
FIG. 4 is a plan view illustrating memory blocks of a cell array according to an embodiment of the present disclosure.

FIG. 4 is a plan view illustrating memory blocks of a cell array according to an embodiment of the present disclosure. The vertical direction Z, the first horizontal direction X and the second horizontal direction Y as shown in FIG. 4 are the same as those described above with reference to FIG. 3.

Referring to FIG. 4, memory blocks BLKn−1, BLKn, and BLKn+1, according to an embodiment of the present disclosure, may be separated from each other by slits SI. The memory blocks BLKn−1, BLKn, and BLKn+1 may be arranged in the first horizontal direction X. Each of the slits SI may be arranged between the memory blocks BLKn−1, BLKn, and BLKn+1 adjacent to each other in the first horizontal direction X and may extend in the second horizontal direction Y. According to the above-described structure, each of the memory blocks BLKn−1, BLKn, and BLKn+1 may be arranged between neighboring slits SI in the first horizontal direction X.

Isolation insulating layers SEP may be arranged in the memory blocks BLKn−1, BLKn, and BLKn+1. Each of the isolation insulating layers SEP may fill the trench T, described above with reference to FIG. 3. Each of the isolation insulating layers SEP and the trench T, as shown in FIG. 3, may have various shapes, such as wavy, straight and zigzag patterns, extending in the second horizontal direction Y. At least one of the isolation insulating layers SEP may be arranged between neighboring slits SI in the first horizontal direction X. The number of isolation insulating layers SEP arranged in each of the memory blocks BLKn−1, BLKn, and BLKn+1 may not be limited to that of FIG. 3. The number of isolation insulating layers SEP arranged in each of the memory blocks BLKn−1, BLKn, and BLKn+1 may vary, depending on the number of select lines to separate.

The isolation insulating layers SEP and the trench T, as described above with reference to FIG. 3, might not completely pass through the memory blocks BLKn−1, BLKn, and BLKn+1. More specifically, each of the isolation insulating layers SEP and the trench T may be deep enough to separate the select lines SEL as shown in FIG. 3 and might not be deep enough to reach the word lines WL. In other words, each of the isolation insulating layers SEP may have a shallower depth than each of the slits SI separating the memory blocks BLKn−1, BLKn, and BLKn+1 from each other. By taking advantage of the differences in depth, the trench T, filled with each of the isolation insulating layers SEP, may be narrower than each of the slits SI. In other words, a width W1 of each of the isolation insulating layers SEP may be smaller than a width W2 of each of the slits SI.

According to an embodiment of the present disclosure, holes H1 and H2 may pass through each of the memory blocks BLKn−1, BLKn, and BLKn+1. Each of the holes H1 and H2 may be filled with a first vertical structure VP1. The holes H1 and H2 may include first holes H1 and second holes H2. The first holes H1 may be arranged next to each other in the first horizontal direction X and the second holes H2 may be arranged next to each other in the first horizontal direction X. The first and second holes H1 and H2 may be arranged in a zigzag pattern. The arrangement of the first holes H1 and the second holes H2 may not be limited to that in FIG. 3. The numbers and arrangements of the first and second holes H1 and H2 may be variously determined to facilitate the introduction of replacement materials.

Each of the memory blocks BLKn−1, BLKn, and BLKn+1 may include the channel structures CH arranged between the first holes H1 and the second holes H2. At least one of the isolation insulating layers SEP may be arranged between the channel structures CH included in each of the memory blocks BLKn−1, BLKn, and BLKn+1. The channel structures CH may include first channel structures 1, adjacent to each of the isolation insulating layers SEP, and second channel structures 2, adjacent to each of the slits SI.

At least two columns of the channel structures CH may be arranged between the slit SI and the isolation insulating layer SEP. The first column may include the first channel structures (1) arranged next to each other in the second horizontal direction Y and the second column may include the second channel structures (2) arranged next to each other in the second horizontal direction Y. At least one column of the channel structures CH may be further arranged between the first column of the first channel structures (1) and the second column of the second channel structures (2). At least two columns of the first channel structures (1) may be arranged between neighboring isolation insulating layers SEP. At least one column of the channel structures CH may be further arranged between the first channel structures (1) between neighboring isolation insulating layers SEP.

To improve the arrangement density of the channel structures CH, the channel structures CH may be arranged in a zigzag pattern. However, the invention is not limited thereto. The channel structures CH may be arranged next to each other in the first horizontal direction X and the second horizontal direction Y.

The slits SI may extend in the second horizontal direction Y, adjacent to the first holes H1 and the second holes H2. Each of the slits SI may be filled with a second vertical structure VP2.

According to an embodiment of the present disclosure, the slits SI may be arranged at boundaries between the memory blocks BLKn−1, BLKn, and BLKn+1. In other words, at least one of the isolation insulating layers SEP may be arranged between the channel structures CH included in each of the memory blocks BLKn−1, BLKn, and BLKn+1. However, the slit SI might not be arranged between the channel structures CH included in each of the memory blocks BLKn−1, BLKn, and BLKn+1. Therefore, the area of the slit SI in each of the memory blocks BLKn−1, BLKn, and BLKn+1 may be reduced. According to an embodiment of the present disclosure, although each of the memory blocks BLKn−1, BLKn, and BLKn+1 is not divided by the slit SI, the holes H1 and H2 may be used as a path along which a replacement material is introduced. Therefore, according to an embodiment of the present disclosure, a replacement material may be introduced into a central area of each of the memory blocks BLKn−1, BLKn, and BLKn+1 through the holes H1 and H2. Hereinafter, various embodiments of the memory blocks BLKn−1, BLKn, and BLKn+1 will be described in more detail with reference to FIGS. 5A to 5D and 6.

FIGS. 5A to 5D are diagrams illustrating various cross sections of a semiconductor device taken along line I-I' of FIG. 4. FIG. 6 is a diagram illustrating a cross section of a semiconductor device taken along line II-II' of FIG. 4.

Referring to FIGS. 5A to 5D and 6, each of the memory blocks BLKn−1, BLKn, and BLKn+1 as shown in FIG. 4 may include a gate stacked structure GST. The gate stacked structure GST may include interlayer insulating layers ILD and conductive patterns CP, which are alternately stacked in the vertical direction Z.

According to an embodiment of the present disclosure, each of the conductive patterns CP may include an electrode pattern E for low-resistance lines and a barrier pattern BM for preventing a direct contact between the electrode pattern E and each of the interlayer insulating layers ILD. Tungsten may be used as the electrode pattern E for low-resistance lines. A titanium nitride TiN may be used as the barrier pattern BM. However, the present invention is not limited thereto. The conductive patterns CP may include various other conductive materials. For example, the conductive patterns CP may include at least one of a silicon layer, a metal silicide layer, a metal layer and a metal nitride layer.

The interlayer insulating layers ILD may include various insulating materials. For example, each of the interlayer insulating layers ILD may include a silicon oxide layer.

The interlayer insulating layers ILD and the conductive patterns CP may be penetrated by the channel structures CH. In other words, the channel structures CH may be surrounded by the interlayer insulating layers ILD and the conductive patterns CP. The multilayer film ML may be arranged between each of the channel structures CH and the gate stacked structure GST.

A first blocking insulating layer BI1 may be formed on a surface of each of the conductive patterns CP. The first blocking insulating layer BI1 may extend along a sidewall of each of the interlayer insulating layers ILD. The first blocking insulating layer BI1 may include an insulating material having a high dielectric constant. For example, the first blocking insulating layer BI1 may include an aluminum oxide. However, the first blocking insulating layer BI1 may be removed.

Referring to FIGS. 5A to 5D, the interlayer insulating layers ILD and the conductive patterns CP may be penetrated by the holes H as shown in FIG. 4. As described above with reference to FIG. 4, the holes H may include the first holes H1 and the second holes H2.

When the first blocking insulating layer BI1 is formed, the first blocking insulating layer BI1 may extend to the sidewall of each of the interlayer insulating layers ILD toward a sidewall of each of the holes H. When each of the conductive patterns CP includes the barrier pattern BM, the barrier pattern BM surrounding the electrode pattern E may have a C-shaped cross-section opened toward each of the holes H.

The holes H may be individually filled with the first vertical channels VP1. Each of the first vertical structures VP1 may be formed according to various embodiments.

Figure 5A:
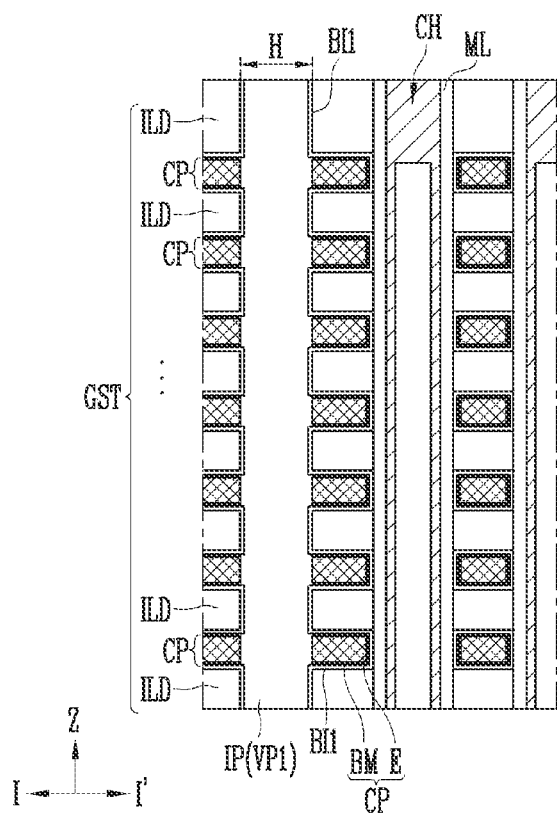
FIGS. 5A to 5D are diagrams illustrating various cross sections of a semiconductor device taken along line I-I' of FIG. 4.
Figure 5B:
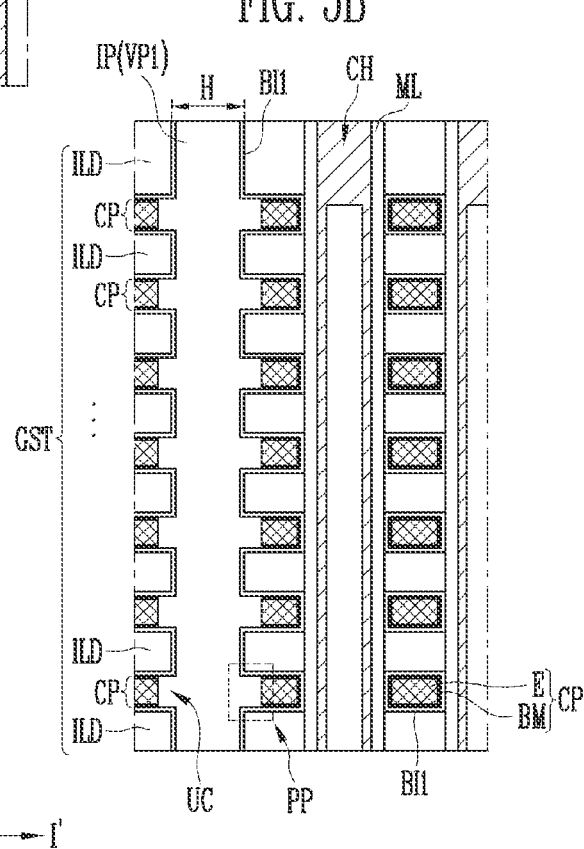
Figure 6:
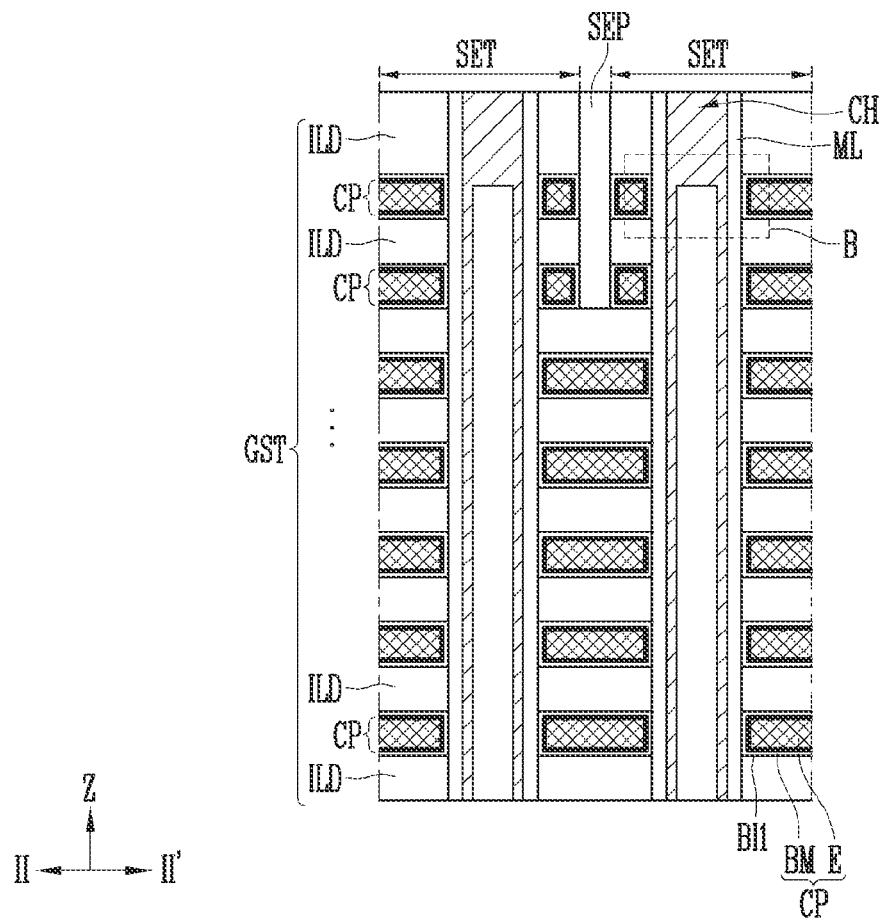
FIG. 6 is a diagram illustrating a cross-section of a semiconductor device taken along line II-II' of FIG. 4.

Referring to FIGS. 5A and 5B, each of the first vertical structures VP1 may be an insulating pillar IP filling each of the holes H. The insulating pillar IP may include an insulating material completely filling each of the holes H. For example, the insulating pillar IP may include a silicon oxide layer.

Figure 5C:
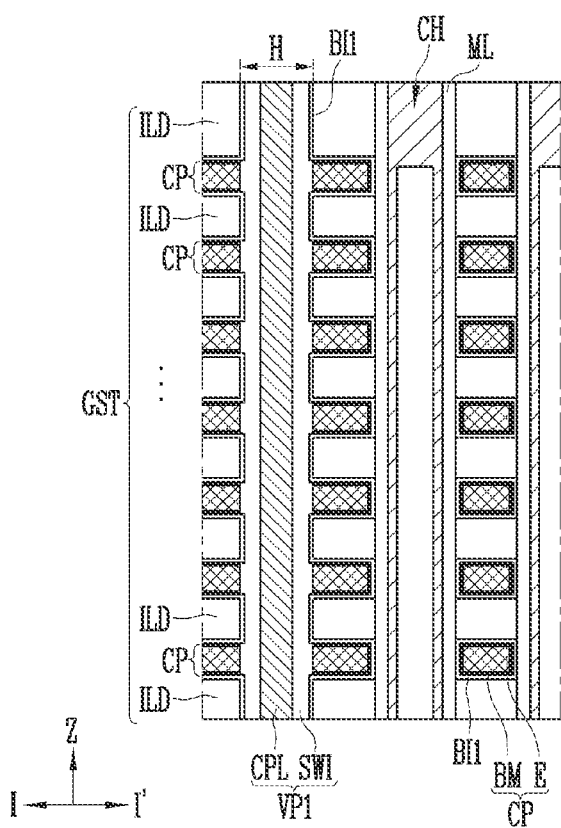
Figure 5D:
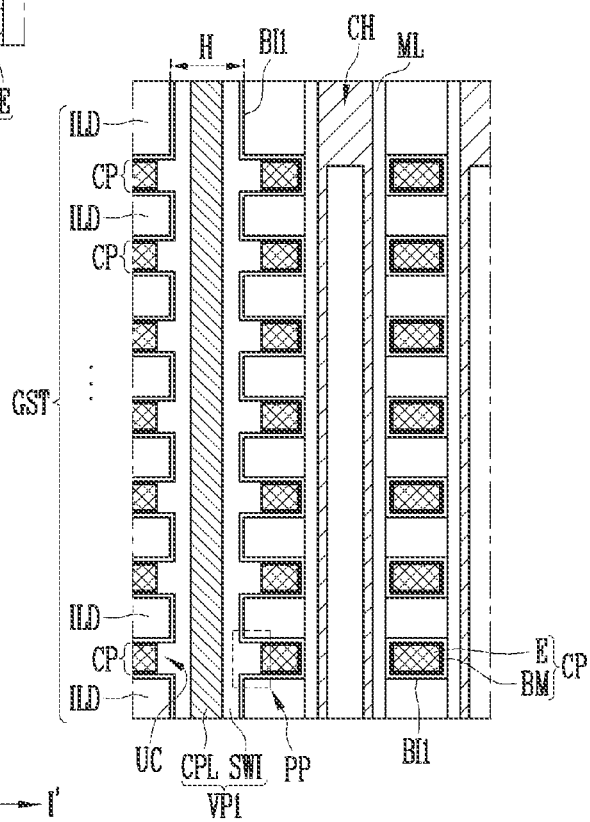

Referring to FIGS. 5C and 5D, each of the first vertical structures VP1 may include a sidewall insulating layer SWI covering each of the holes H and a conductive contact pillar CPL filling each of the holes H. The conductive contact pillar CPL may be insulated from the conductive patterns CP by the sidewall insulating layer SWI. The conductive contact pillar CPL may completely fill the central area of each of the holes H.

Referring to FIGS. 5B and 5D, each of the first vertical structures VP1 may include protruding portions PP protruding toward the conductive patterns CP. The protruding portions PP may fill undercut portions UC defined by side portions of the interlayer insulating layers ILD protruding toward the holes H further than the conductive patterns CP. In other words, each of the protruding portions PP may correspond to an extension between neighboring interlayer insulating layers ILD in the vertical direction Z. Referring to FIG. 5B, the insulating pillar IP may include the protruding portions PP extending toward the undercut portions UC. Referring to FIG. 5D, the sidewall insulating layer SWI may include the protruding portions PP extending toward the undercut portions UC.

Referring to FIG. 6, the gate stacked structure GST may include select stacked structures SET. The select stacked structures SET may be separated from each other by the isolation insulating layer SEP as arranged in the layout shown in FIG. 4. The isolation insulating layer SEP may pass through at least an uppermost conductive pattern of the conductive patterns CP of the gate stacked structure GST. The isolation insulating layer SEP may further pass through at least one layer of a conductive pattern arranged under the uppermost conductive pattern. The conductive patterns CP penetrated by the isolation insulating layer SEP may serve as the select lines as described above with reference to FIG. 3. The conductive patterns CP, arranged under the isolation insulating layer SEP, may serve as the word lines as described above with reference to FIG. 3.

Figure 7:
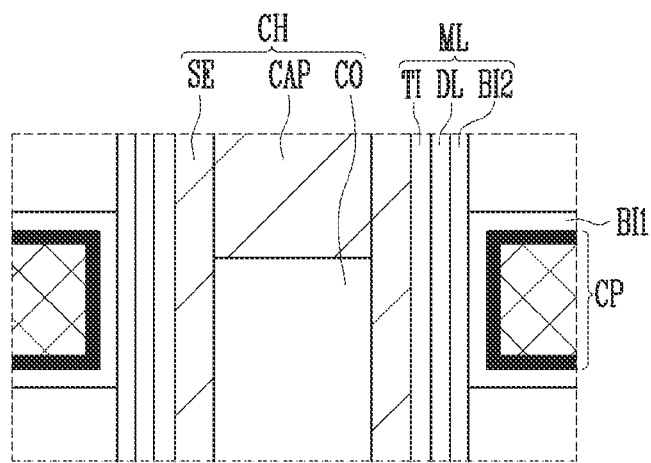
FIG. 7 is an enlarged view of a region B shown in FIG. 6.

FIG. 7 is an enlarged view of a region B shown in FIG. 6. FIG. 7 is a detailed diagram illustrating the channel structure CH and the multilayer film ML as shown in FIGS. 5A to 5D and 6.

Referring to FIG. 7, the channel structure CH may include a semiconductor layer SE. The semiconductor layer SE may be conformally formed on an inner wall of the multilayer film ML or may completely fill a central area of the multilayer film ML. The semiconductor layer SE may include a semiconductor material such as a silicon layer.

When the semiconductor layer SE is conformally formed on the inner wall of the multilayer film ML, the channel structure CH may further include a core insulating layer CO and a capping pattern CAP which fill a central area of the semiconductor layer SE. The core insulating layer CO may extend less in the vertical direction Z than the semiconductor layer SE. The capping pattern CAP may be surrounded by a top end of the semiconductor layer SE, which extends in the vertical direction Z further than the core insulating layer CO, and may be arranged on the core insulating layer CO. The capping pattern CAP may contact the semiconductor layer SE. The capping pattern CAP may include a doped semiconductor layer doped with impurities. For example, the capping pattern CAP may include a doped silicon layer including an n type impurity. The capping pattern CAP may extend to be adjacent to the conductive pattern CP of the select stacked structure SET as shown in FIG. 6.

The multilayer film ML may extend along the sidewall of the channel structure CH. When the first blocking insulating layer BI1 is formed, the first blocking insulating layer BI1 may extend along an interface between the multilayer film ML and the conductive pattern CP. The multilayer film ML may include a tunnel insulating layer TI surrounding the channel structure CH, a data storage layer DL surrounding the tunnel insulating layer TI, and a second blocking insulating layer BI2 surrounding the data storage layer DL.

The data storage layer DL may include a charge trap layer, a material layer including conductive nanodots, or a phase-change material layer.

The data storage layer DL may store data which changes by using Fowler-Nordheim tunneling, caused by the voltage difference between each of the word lines WL and the channel structure CH corresponding thereto, as described above with reference to FIG. 3. The data storage layer DL may include a silicon nitride layer enabling charge trapping.

The data storage layer DL may store data on the basis of another operating principle other than Fowler-Nordheim tunneling. For example, the data storage layer DL may include a phase-change material layer and store data according to a phase change.

The second blocking insulating layer BI2 may include an oxide layer capable of blocking charges. The tunnel insulating layer TI may include a silicon oxide layer, enabling charge tunneling. However, one of the first blocking insulating layer BI1 and the second blocking insulating layer BI2 may be removed.

A method of manufacturing a semiconductor device according to an embodiment of the present disclosure may include forming a stacked structure, penetrated by channel structures, and performing a replace process by which some of the material layers of the stacked structure are replaced.

FIGS. 8A to 8D, 9 and 10 are diagrams illustrating a method of manufacturing a semiconductor device according to an embodiment of the present disclosure.

Figure 8A:
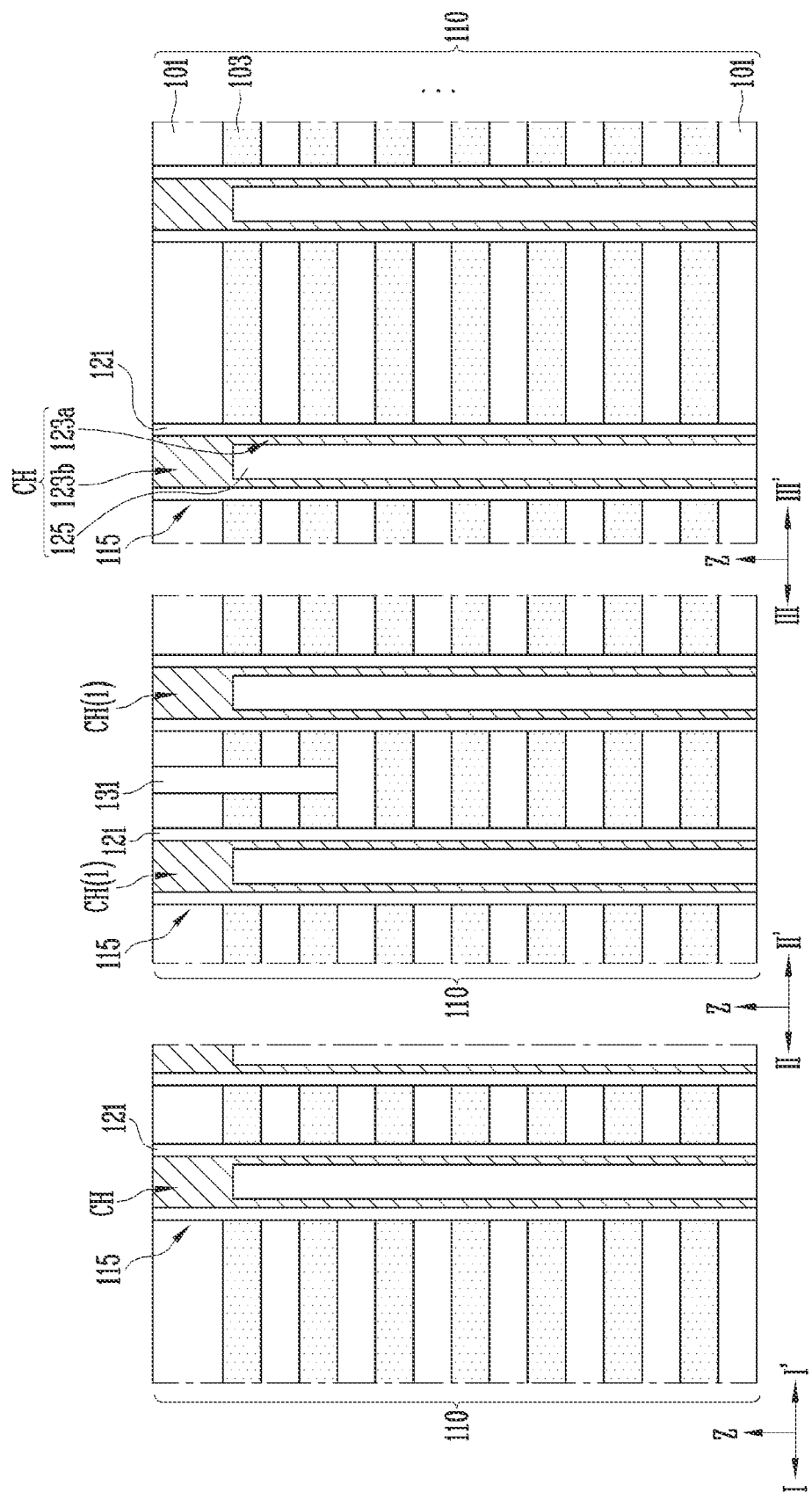
Figure 8B:
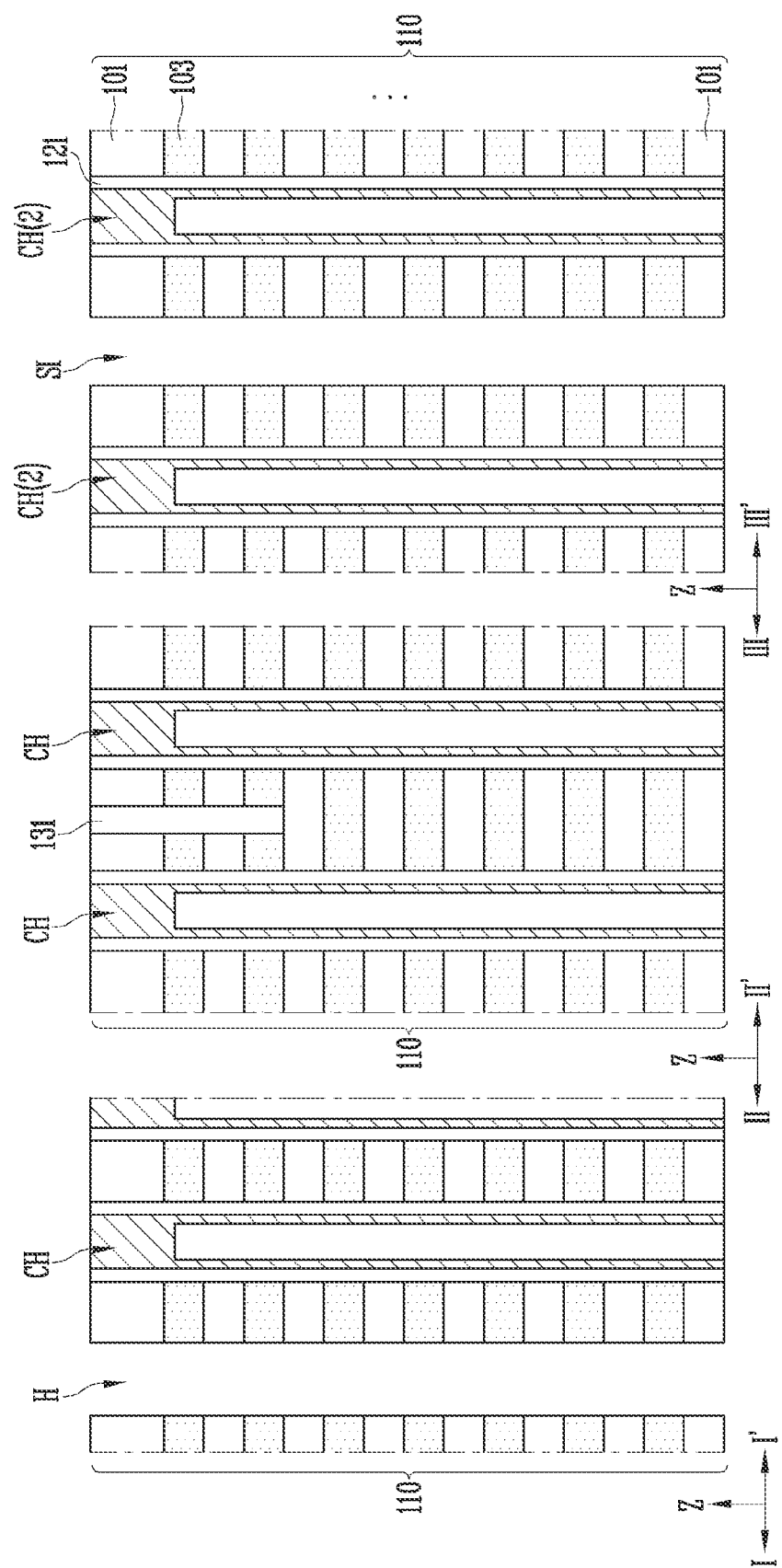

FIG. 8A is a cross-sectional diagram illustrating a process of forming a stacked structure penetrated by channel structures. FIGS. 8B to 8D are cross-sectional diagrams sequentially showing manufacturing processes included in a replace process. FIGS. 8A to 8D show cross sections illustrating a semiconductor device taken along lines I-I', II-II' and III-III' shown in FIG. 4.

Referring to FIG. 8A, first material layers 101 and second material layers 103 may be alternately stacked in the vertical direction Z to form a stacked structure 110. The first material layers 101 may include a different material from the second material layers 103.

According to an embodiment of the present disclosure, the first material layers 101 may include an insulating material for interlayer insulating layers, and the second material layers 103 may include sacrificial material layers having a different etch rate from the first material layers 101. For example, the first material layers 101 may include silicon oxide layers, and the second material layers 103 may include nitride layers.

According to another embodiment of the present disclosure, the first material layers 101 may include a conductive material for conductive patterns, and the second material layers 103 may include sacrificial material layers having a different etch rate from the first material layers 101. In this example, the first material layers 101 may include doped silicon layers, and the second material layers 103 may include undoped silicon layers.

After the stacked structure 110 is formed, the channel structures CH may be formed through the first material layers 101 and the second material layers 103 of the stacked structure 110.

Forming the channel structures CH may include forming channel holes 115 and filling the channel holes 115 with the channel structures CH. Before the channel structures CH are formed in the channel holes 115, a multilayer film 121 may be further formed on each of the channel holes 115. The multilayer film 121 may include the same material layers as the multilayer film ML described above with reference to FIG. 7.

Each of the channel structures CH may include a semiconductor material. Each of the channel structures CH may be divided into a first region 123a and a second region 123b on the first region 123a. The first region 123a and the second region 123b may be formed on an inner sidewall of each of the channel holes 115 or an inner sidewall of the multilayer film 121. A central area of the first region 123a may be filled with a core insulating layer 125. The second region 123b may be arranged on the first region 123a and the core insulating layer 125. The second region 123b may include an impurity. For example, the second region 123b may include an n type impurity. The first region 123a and the second region 123b may be formed by the semiconductor layer SE and the capping pattern CAP as shown in FIG. 7.

According to an embodiment of the present disclosure, forming the channel structures CH may include forming a first semiconductor layer on a surface of each of the channel holes 115 or a surface of the multilayer film 121. The first semiconductor layer may be formed to completely fill each of the holes 115 or to open the central area of each of the channel holes 115.

When the central area of the channel holes 115 is opened by the first semiconductor layer, forming the channel structures CH may include filling the central area of each of the channel holes 115 with a core insulating layer 125, forming a recess region, opening an upper end of the central area of each of the channel holes 115 by etching an upper end of the core insulating layer 125, and filling the recess region with a second semiconductor layer. The second semiconductor layer may be a doped semiconductor layer. A channel layer including the first region 123a and the second region 123b may be formed by the above-described first and second semiconductor layers.

An isolation insulating layer 131 may be arranged between neighboring channel structures 1 among the channel structures CH. As described above with reference to FIG.

4, the isolation insulating layer 131 may extend in the second horizontal direction Y as described above with reference to FIG. 4. The isolation insulating layer 131 might not completely pass through the stacked structure 110 and may extend to a depth less than that of the channel structures CH. The isolation insulating layer 131 may pass through at least one of the first material layers 101 and at least one of the second material layers 103. The isolation insulating layer 131 may be formed before or after the channel holes H are formed.

Referring to FIG. 8B, after the channel structures CH and the isolation insulating layer 131 are formed in the stacked structure 110, the holes H and the slits SI may be formed through the stacked structure 110. The holes H and the slits SI may completely pass through the stacked structure 110. The holes H and the slits SI may be longer than the isolation insulating layer 131. The holes H and the slits SI may be formed by etching the first material layers 101 and the second material layers 103 by using a mask pattern including openings corresponding to the holes H and the slits SI as an etch barrier.

The slit SI may be arranged between neighboring channel structures 2 among the channel structures CH. The layout of the holes H, the slits SI and the channel structures CH may be the same as that described above with reference to FIG. 4. The slits SI and the holes H may be deeper than the isolation insulating layer 131. Each of the slits SI and the holes H may be wider than the isolation insulating layer 131 so that a bottom surface of each of the slits SI and the holes H may not be blocked by the stacked structure 110. The holes H may have a less area than the slits SI in a line shape extending in one direction as shown in FIG. 4 and be arranged according to the layout of the channel structures CH.

Referring to FIG. 8C, the second material layers 103 as shown in FIG. 8B may be removed through the holes H and the slits SI by using a selective etch process. As a result, interlayer gaps 141 may be opened between the first material layers 101. Each of the interlayer gaps 141 may be defined between the first material layers 101 adjacent to each other in the vertical direction Z.

Referring to FIG. 8D, a third material layer 149 may be formed through the holes H and the slits SI to fill the interlayer gaps 141 as shown in FIG. 8C. The third material layer 149 may completely fill each of the interlayer gaps 141 and extend to a sidewall of each of the holes H and a sidewall of each of the slits SI.

Before the third material layer 149 is formed, a first blocking insulating layer 143 may be further formed on a surface of each of the interlayer gaps 141 as shown in FIG. 8C. The first blocking insulating layer 143 may extend along the surfaces of the interlayer gaps 141, sidewalls of the channel structures CH, the sidewall of the isolation insulating layer 131, surfaces of the holes H and surfaces of the slits SI. The third material layer 149 may be formed on the first blocking insulating layer 143. The first blocking insulating layer 143 may include insulating material blocking charges. When the multilayer film 121 includes a second blocking insulating layer as described above with reference to FIG. 7, the first blocking insulating layer 143 may include an insulating material having a higher dielectric constant than the second blocking insulating layer of the multilayer film 121. For example, the first blocking insulating layer 143 may include a metal oxide such as an aluminum oxide and a hafnium oxide. According to an embodiment of the present disclosure, one of the first blocking insulating layer 143 and the second blocking insulating layer may be removed.

According to an embodiment of the present disclosure, when the first material layers 101 includes an insulating material for interlayer insulating layers and the removed second material layers are sacrificial material layers, the third material layer 149 may include a conductive material. When the third material layer 149 includes a conductive material, the third material layer 149 may include a barrier layer 145 and an electrode layer 147.

The barrier layer 145 may block metal from the electrode material 147 from being diffused into the first blocking insulating layer 143, the first material layers 101, or the multilayer film 121. The barrier layer 145 may include a metal nitride. Examples of the metal nitride may include a titanium nitride, a tungsten nitride or a tantalum nitride.

The electrode layer 147 may include a metal for low-resistance lines. More specifically, the electrode layer 147 may include at least one of a metal layer and a metal silicide layer. For example, the metal layer may include tungsten and the metal silicide layer may include tungsten silicide. However, the present disclosure is not limited thereto, and the metal layer or the metal silicide layer may include various metals.

FIG. 8D shows an example in which the third material layer 149 includes a conductive material. However, the present invention is not limited thereto. According to an embodiment of the present disclosure, when the first material layers 101 include a conductive material for conductive patterns and the removed second material layers are sacrificial material layers, the third material layer 149 may include an insulating material for interlayer insulating layers.

FIG. 9 is a plan view illustrating a path along which the third material layer is moved.

As described above with reference to FIGS. 8B and 8C, according to an embodiment of the present disclosure, the second material layers of the stacked structure may be replaced by the third material layer. Arrows shown in FIG. 9 may display a moving path of the third material layer.

As shown in FIG. 9, each of the slits SI may extend in the second horizontal direction Y as described above with reference to FIG. 4, and the holes H may be divided into the first holes H1 and the second holes H2 as described above with reference to FIG. 4. The first holes H1 may be arranged next to each other in the first horizontal direction X and the second holes H2 may be arranged next to each other in the first horizontal direction X.

The channel structures CH may be disposed between the first holes H1 and the second holes H2. The first and second holes H1 and H2 may be arranged in a zigzag pattern. A pitch between the first holes H1 and a pitch between the second holes H2 may be set to various values to facilitate replacement of the second material layers by the third material layer. According to an embodiment, each of the first holes H1 may be arranged next to even channel structures in the second horizontal direction Y, among the channel structures CH arranged in the zigzag pattern in the first horizontal direction X. Each of the second holes H2 may be arranged next to odd channel structures in the second horizontal direction Y, among the channel structures CH arranged in the zigzag pattern in the first horizontal direction X. The first holes H1 may be arranged in a zigzag pattern with the odd channel structures, among the channel structures CH arranged in the zigzag pattern, and the second holes H2 may be arranged in a zigzag pattern with the even channel structures, among the channel structures CH arranged in the zigzag pattern.

Each of the slits SI may extend between a pair of the first holes H1 corresponding thereto. Each of the slits SI may extend between a pair of the second holes H2 corresponding thereto. One isolation insulating layer 131 may be arranged between the slits SI adjacent to each other in the first horizontal direction X, or two or more isolation insulating layers 131 may be arranged therebetween.

According to an embodiment of the present disclosure, the third material layer 149 described above with reference to FIG. 8D may be introduced into the interlayer gaps 141 described above with reference to FIG. 8C through each of the slits SI and the holes H. The third material layer 149 may be inserted in the first horizontal direction X toward the isolation insulating layer 131 through the slits SI and may fill spaces between the channel structures CH. The third material layer 149 may be inserted toward regions between the first holes H1 and the second holes H2 from the first holes H1 and the second holes H2, and may fill spaces between the channel structures CH.

According to an embodiment of the present disclosure, even when the slit SI is not arranged between the isolation insulating layers 131, the third material layer may be easily introduced to a central area CA of a memory block through the holes H.

However, for example, when the central area CA of the memory block is arranged between the isolation insulating layers 131 and the holes H are not formed, the central area CA may be blocked by the isolation insulating layers 131, which may not allow the insertion of the third material layer. An auxiliary slit having the same depth as the slit SI may be arranged between the isolation insulating layers 131 so as to facilitate the insertion of the third material layer. However, space between the channel structures CH may be increased by the area of the auxiliary slit. According to an embodiment of the present disclosure, even when the auxiliary slit is not arranged between the channel structures CH, the third material layer may be easily introduced to the central area CA of the memory block through the holes H.

According to an embodiment of the present disclosure, an etching material for removing the second material layers may also be introduced through the holes H.

According to an embodiment of the present disclosure, fumes generated when the second material layers are removed, or when the third material layer is formed may be eliminated through the holes H as well as the slits SI, so that the fumes may be easily removed. Therefore, the fumes may be prevented from remaining in the interlayer gaps as shown in FIG. 8C to cause a defect.

According to an embodiment of the present disclosure, even when the number of isolation insulating layers 131, disposed between neighboring slits SI, and the number of channel structures CH arranged in the first horizontal direction X are not limited, the second material layers may be easily replaced by the third material layer in the central area CA of the memory block. Therefore, according to an embodiment of the present disclosure, the degree of freedom for the arrangement of the channel structures CH forming the memory block may be increased.

FIG. 10 is a cross-sectional diagram illustrating subsequent processes to a replace process.

Referring to FIG. 10, a portion of the third material layer 149 described above with reference to FIG. 8D may be etched so that the third material layer 149 may be divided into third material patterns 149P1. The third material layer 149 may be removed from each of the slits SI and each of the holes H to expose the first blocking insulating layer 143.

Each of the third material patterns 149P1 may surround the channel structures CH. Each of the third material patterns 149P1 may include a barrier pattern 145P1 having a C-shaped cross section opened toward each of the holes H and an electrode pattern 147P1, surrounded by the barrier pattern 145P1. The third material patterns 149P1 may be separated from each other in the vertical direction Z. The third material patterns 149P1 may be separated from each other by the slits SI. The third material patterns 149P1 may be formed through the holes H.

Each of the slits SI and each of the holes H may be completely filled with an insulating material 151. As a result, vertical structures, including the insulating material 151, may be formed in the slits SI and the holes H.

Figure 13:
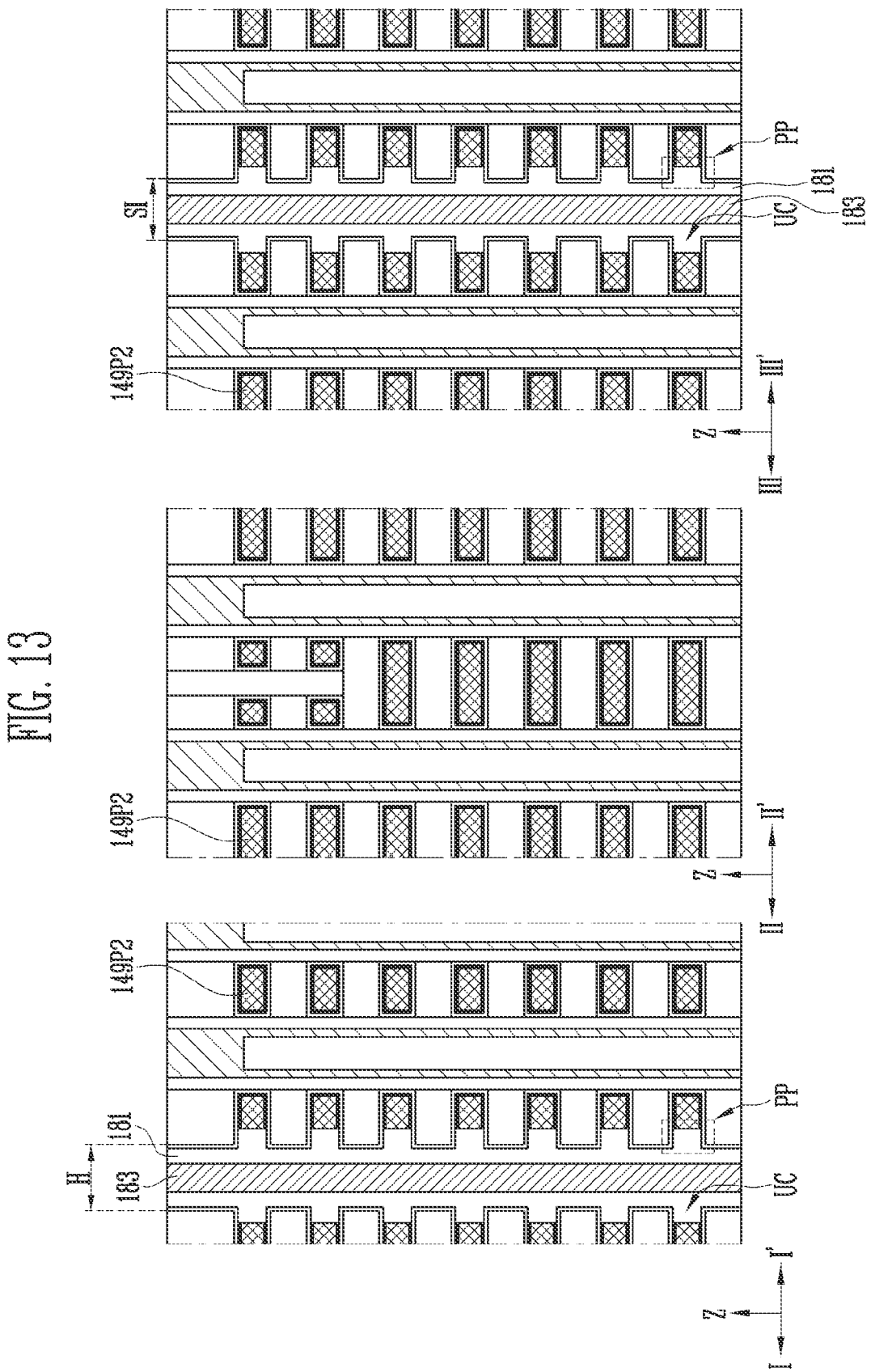

FIGS. 11 to 13 are cross-sectional diagrams illustrating various modifications of processes subsequent to a replace process. FIGS. 11 to 13 show cross sections illustrating a semiconductor device taken along lines I-I', II-II' and III-III' shown in FIG. 4. FIGS. 11 to 13 are cross-sectional views illustrating subsequent processes performed after the processes as described above with reference to FIGS. 8A to 8D and 9.

According to an embodiment shown in FIG. 11, the third material patterns 149P1, the same as those described above with reference to FIG. 10, may be formed using the same etching process as that described above with reference to FIG. 10.

A sidewall insulating layer 161, covering a sidewall of each of the slits SI and a sidewall of each of the holes H, may be formed. The sidewall insulating layer 161 may include an oxide layer. The sidewall insulating layer 161 may open a bottom surface of each of the slits SI and the holes H. Each of the slits SI and the holes H, opened by the sidewall insulating layer 161, may be filled with a conductive material 163. The conductive material 163 may include at least one of a doped semiconductor layer, metal, and a metal silicide layer. Therefore, a vertical structure including the conductive material 163, surrounded by the sidewall insulating layer 161, may be formed in each of the slits SI and the holes H.

According to the embodiment shown in FIG. 12, the third material layer 149, described above with reference to FIG. 8D, may be divided into third material patterns 149P2 by using the same etching process as described above with reference to FIG. 10. However, the third material layer 149 may be over-etched in comparison with the embodiment shown in FIG. 10. As a result, the undercut portions UC may be defined between the first material layers 101, adjacent to each other in the vertical direction Z by the sidewalls of the third material patterns 149P2 and the first material layers 101.

The undercut portions UC may be coupled to the slits SI and the holes H. Each of the slits SI and the holes H may be completely filled with an insulating material 171. As a result, vertical structures, including the insulating material 171, may be formed in the slits SI and the holes H. The insulating material 171, forming each of the stacked structures, may include the protruding portions PP filling the undercut portions UC.

According to the embodiment shown in FIG. 13, the third material patterns 149P2, the same as those described above with reference to FIG. 12, may be formed using the same etching process as described above with reference to FIG. 12. A sidewall insulating layer 181, covering a sidewall of each of the slits SI and a sidewall of each of the holes H, may be formed. The sidewall insulating layer 181 may include an oxide layer. The sidewall insulating layer 181 may open the bottom surface of each of the slits SI and the holes H. The sidewall insulating material 181 may include the protruding portions PP filling the undercut portions UC.

Each of the slits SI and the holes H, opened by the sidewall insulating layer 181, may be filled with a conductive material 183. The conductive material 183 may include at least one of a doped semiconductor layer, metal, and a metal silicide layer. Therefore, a vertical structure, including the conductive material 183 surrounded by the sidewall insulating layer 181, may be formed in each of the slits SI and the holes H.

According to the above-described embodiments, by replacing the second material layers, surrounding the channel structures with the third material patterns through the holes, the third material patterns may be easily formed to reach the central area of the memory block. Through the above-described embodiments, the gate stacked structures, as described above with reference to FIGS. 5A to 5D, may be formed.

Figure 14A:
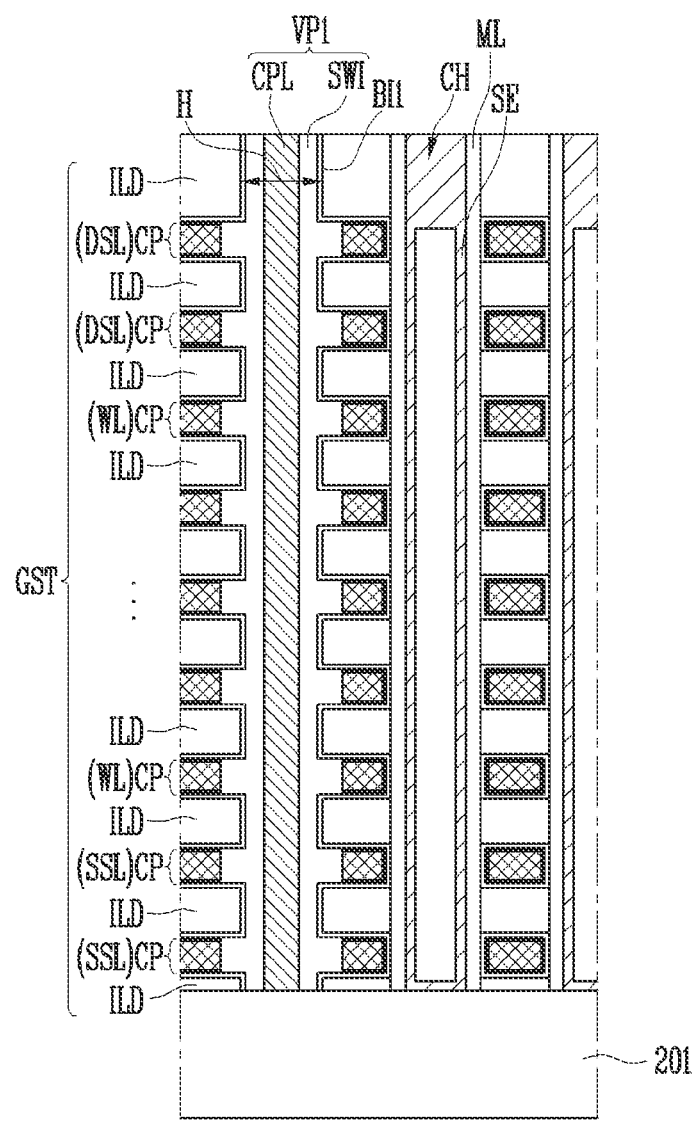
FIGS. 14A to 14C are cross-sectional diagrams illustrating various lower structures located under a gate stacked structure according to an embodiment of the present disclosure.
Figure 14B:
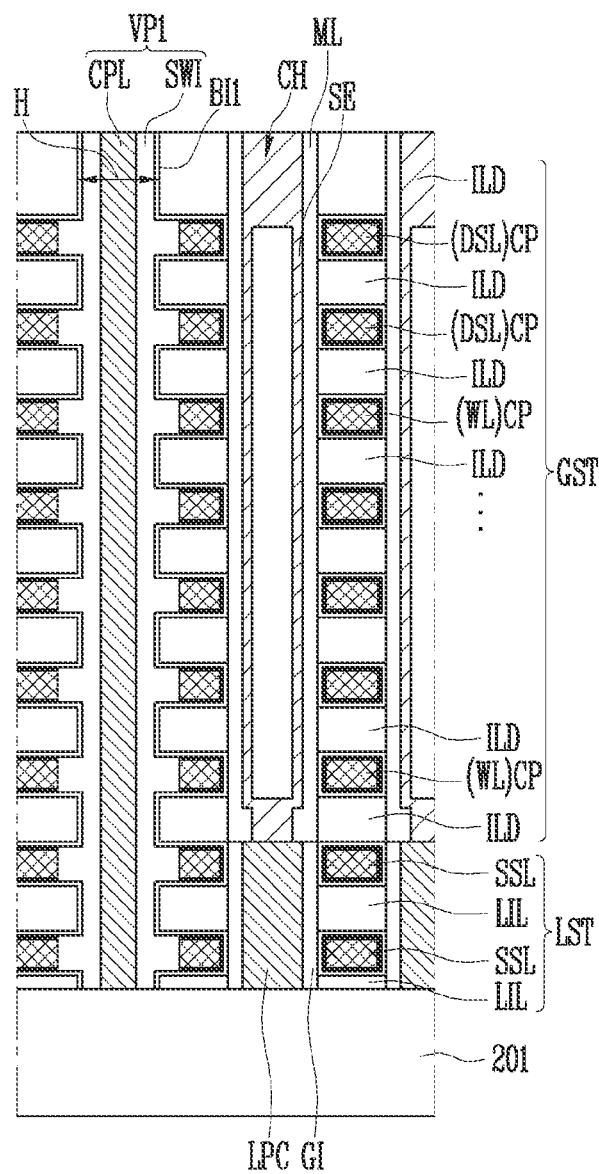
Figure 14C:
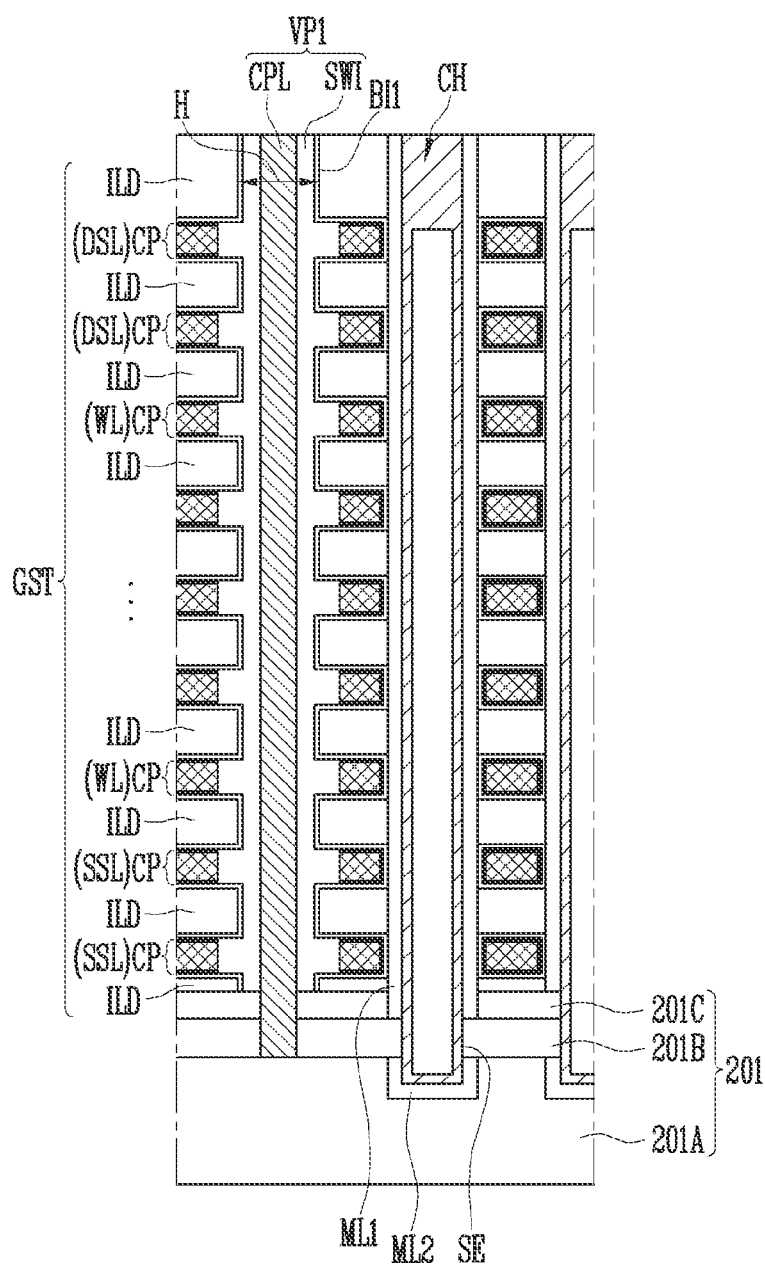

FIGS. 14A to 14C are cross-sectional diagrams illustrating various lower structures located under the gate stacked structure GST according to an embodiment of the present disclosure. FIGS. 14A to 14C are cross-sectional diagrams of a semiconductor device taken along line I-I' of FIG. 4.

Referring to FIGS. 14A to 14C, the gate stacked structure GST may be formed on a doped semiconductor layer 201. The doped semiconductor layer 201 may serve as a source region. The doped semiconductor layer 201, serving as the source region, may include n type impurities. The doped semiconductor layer 201 may be formed in a single layer as shown in FIGS. 14A and 14B, or may include two or more layers 201A, 201B, and 201C sequentially stacked on each other as shown in FIG. 14C. The doped semiconductor layer 201 may be formed by injecting impurities into the surface of the substrate, depositing at least one doped silicon layer on the substrate, or depositing at least one doped silicon layer onto an insulating layer.

The gate stacked structure GST may include the interlayer insulating layers ILD and the conductive patterns CP, which are alternately stacked, as described above with reference to FIGS. 5A to 5D. An uppermost pattern of the conductive patterns CP may be a drain select line DSL serving as a gate electrode of a drain select transistor. However, the present disclosure is not limited thereto. One or more conductive patterns arranged right under the uppermost layer of the conductive patterns CP forming the gate stacked structure GST may serve as drain select lines DSL.

The remaining conductive patterns of the gate stacked structure GST which are located under the conductive patterns serving as the drain select lines DSL may serve as the word lines WL or a source select line SSL.

According to the embodiments described with reference to FIGS. 14A and 14C, a lowermost pattern of the conductive patterns CP may be a source select line SSL serving as a gate electrode of a source select transistor. However, the present disclosure is not limited thereto. One or more conductive patterns, arranged right under the lowermost layer of the conductive patterns CP, forming the gate stacked structure GST, may serve as source select lines SSL. Intermediate patterns interposed between the source select line SSL and the drain select line DSL, among the conductive patterns CP forming the gate stacked structure GST, may serve as the word lines WL. Each of the word lines WL may serve as a gate electrode of a memory cell.

According to the embodiment shown in FIG. 14B, the remaining conductive patterns located under the drain select line DSL, among the conductive patterns CP forming the gate stacked structure GST, may serve as the word lines WL. A lower stacked structure LST may be further formed between the gate stacked structure GST and the doped semiconductor layer 201. The lower stacked structure LST may include at least one lower interlayer insulating layer LIL and at least one source select line SSL, which are alternately stacked. The source select line SSL may be formed by using the processes for forming the conductive patterns CP and have the same structure as the conductive patterns CP.

Referring to FIGS. 14A to 14C, the semiconductor layer SE, of each of the channel structures CH, passing through the gate stacked structure GST, may be coupled to the doped semiconductor layer 201.

As shown in FIG. 14A, the bottom surface of the semiconductor layer SE may directly contact the doped semiconductor layer 201. The multilayer film ML, surrounding each of the channel structures CH, may be penetrated by the semiconductor layer SE.

As shown in FIG. 14B, the bottom surface of the semiconductor layer SE may be coupled to a lower channel structure LPC, passing through the lower stacked structure LST. The multilayer film ML, surrounding each of the channel structures CH, may be penetrated by the semiconductor layer SE.

An outer wall of the lower channel structure LPC may be surrounded by the gate insulating layer GI. The doped semiconductor layer 201 may contact the bottom surface of the lower channel structure LPC. The semiconductor layer SE, of each of the channel structures CH, may be coupled to the doped semiconductor layer 201 through the lower channel structure LPC. The lower channel structure LPC may be formed by growing a semiconductor material through a selective epitaxial growth method, or through the depositing of a semiconductor material. The lower channel structure LPC may include n type impurities. The lower channel structure LPC may be doped with impurities by an in-situ doping method or an ion injection method.

As shown in FIG. 14C, the channel structures CH may extend into the doped semiconductor layer 201. The doped semiconductor layer 201 may include first, second and third doped silicon layers 201A, 201B, and 201C, stacked sequentially on top of each other. The channel structures CH may extend into the first doped silicon layer 201A. The semiconductor layer SE, of each of the channel structures CH, may directly contact the second doped silicon layer 201B. The second doped silicon layer 201B may protrude toward the sidewall of the semiconductor layer SE and separate the multilayer film into a first multilayer pattern ML1 and a second multilayer pattern ML2. However, the third doped silicon layer 201C may be removed.

Referring to FIGS. 14A to 14C, the gate stacked structure GST, surrounding the channel structures CH, may be penetrated by the holes H. As described above with reference to FIGS. 5A to 5D, the first vertical structure VP1 may be formed in each of the holes H.

When the semiconductor devices shown in FIGS. 14A to 14C include the first blocking insulating layer BI1, as described above with reference to FIGS. 5A to 5D, the first blocking insulating layer BI1 may extend along an interface between the first vertical structure VP1 and each of the interlayer insulating layers ILD, an interface between the first vertical structure VP1 and the lower interlayer insulating layer LIL, an interface between each of the conductive patterns CP and each of the interlayer insulating layers ILD, and an interface between the source select line SSL and the lower interlayer insulating layer LIL.

Referring to FIGS. 14A to 14C, the gate stacked structure GST surrounding the channel structures CH may be penetrated by the holes H. As described above with reference to FIGS. 5A to 5D, the first vertical structure VP1 may be formed in each of the holes H.

Each of the holes H and the first vertical structure VP1 may extend up to the surface of the doped semiconductor layer 201, as shown in FIG. 14A. Each of the holes H and the first vertical structure VP1 may pass through the lower stacked structure LST and extend up to the surface of the doped semiconductor layer 201 as shown in FIG. 14A. Each of the holes H and the first vertical structure VP1 may extend into the doped semiconductor layer 201 and pass through the third doped semiconductor layer 201C and the second doped semiconductor layer 201B as shown in FIG. 14C.

When the first vertical structure VP1 includes the conductive pillar CPL, surrounded by the sidewall insulating layer SWI, the conductive pillar CPL may extend to directly contact the doped semiconductor layer 201. The conductive pillar CPL may serve as a pickup plug for transferring an electrical signal to the doped semiconductor layer 201.

According to the above-described structure as shown in FIGS. 14A to 14C, memory cells may be formed at intersections between the channel structures CH and the word lines WL, and a drain select transistor may be formed at an intersection between each of the channel structures CH and the drain select line DSL. A source select transistor may be formed at an intersection between each of the channel structures CH as shown in FIGS. 14A to 14C and the source select line SSL or an intersection between the lower channel structure LPC and the source select line SSL. A source select transistor, memory cells and a drain select transistor, which are arranged next to each other along at least one of the lower channel structure LPC and each of the channel structures CH, may be coupled, in series, by at least one of the lower channel structure LPC and each of the channel structures CH, thereby defining a straight type memory string.

According to the above-described embodiment, holes may be used as a path for replacing some of the material layers forming the stacked structure. Accordingly, according to an embodiment of the present disclosure, a replacement material may be easily introduced to reach the central area of the memory block through the holes without increasing the number of slits. As a result, according to an embodiment of the present disclosure, an area of the slits may be reduced to thereby increase the integration density of the semiconductor device.

Figure 15:
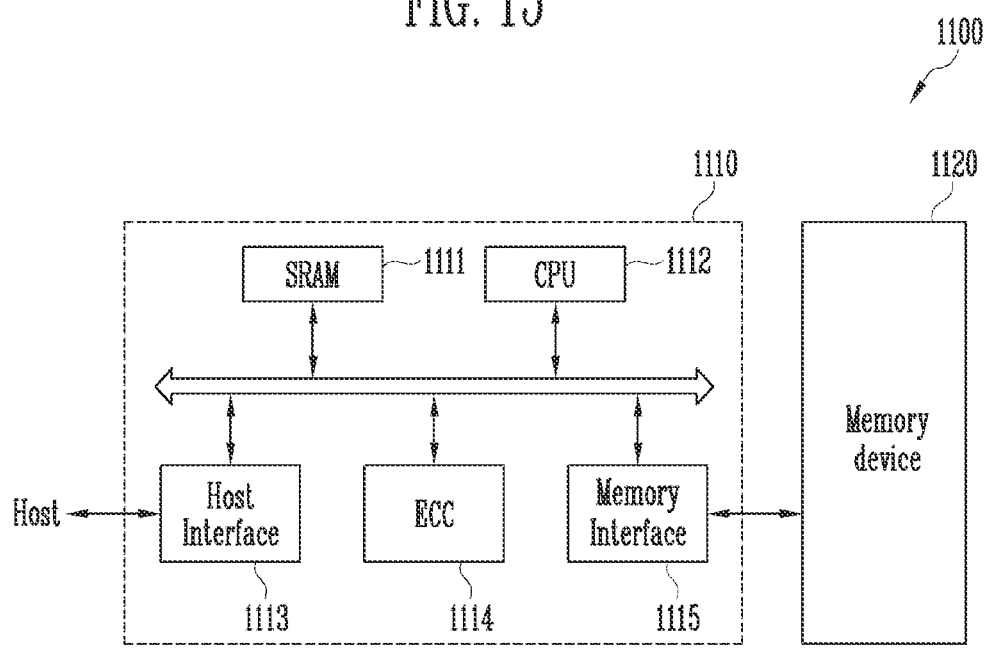
FIG. 15 is a block diagram illustrating the configuration of a memory system according to an embodiment of the present invention.

FIG. 15 is a block diagram illustrating the configuration of a memory system 1100 according to an embodiment of the present disclosure.

Referring FIG. 15, the memory system 1100, according to an embodiment of the present disclosure, may include a memory device 1120 and a memory controller 1110.

The memory device 1120 may be a multi-chip package, including a plurality of flash memory chips. The memory device 1120 may include at least one of the gate stacked structures, according to the above-described embodiments with reference to FIGS. 5A to 5D, or at least one of the three-dimensional semiconductor devices, according to the above-described embodiments with reference to FIGS. 14A to 14C.

The memory controller 1110 may be configured to control the memory device 1120 and include a static random access memory (SRAM) 1111, a CPU 1112, a host interface 1113, an error correction code (ECC) circuit 1114, and a memory interface 1115. The SRAM 1111 may be used as an operation memory of the CPU 1112, the CPU 1112 may perform a control operation for data exchange of the memory controller 1110, and the host interface 1113 may include a data exchange protocol of a host accessing the memory system 1100. In addition, the ECC circuit 1114 may detect and correct errors, included in the data read from the memory device 1120, and the memory interface 1115 may perform interfacing with the memory device 1120. In addition, the memory controller 1110 may further include a read only memory (ROM) for storing code data for interfacing with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express PCI-E( ), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 16:
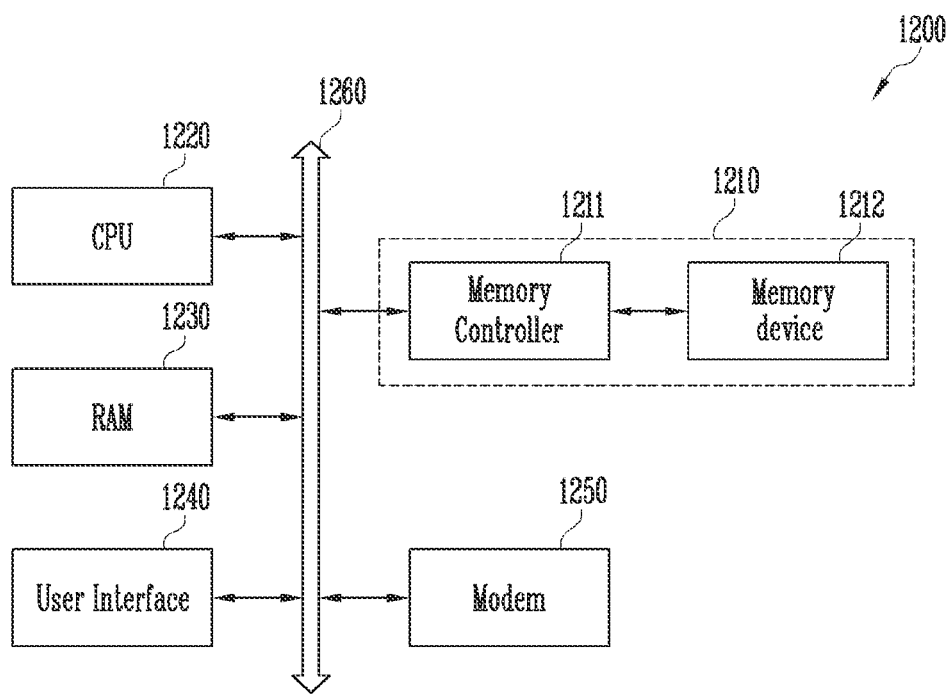
FIG. 16 is a block diagram illustrating the configuration of a computing system according to an embodiment of the present disclosure.

FIG. 16 is a block diagram, illustrating the configuration of a computing system 1200 according to an embodiment of the present disclosure.

Referring to FIG. 16, the computing system 1200, according to an embodiment of the present disclosure, may include a CPU 1220, a random access memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

The embodiments, disclosed in the present specification and the drawings, aim to help those with ordinary knowledge in this art more clearly understand the present disclosure rather than aiming to limit the bounds of the present disclosure. It should be understood that many variations and modifications of the basic inventive concept described herein will still fall within the spirit and scope of the present disclosure as defined in the accompanying claims and equivalents thereof.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings. So far as not being clearly defined in this application, terms should not be understood in an ideally or excessively formal way.

What is claimed is:

1. A semiconductor device, comprising:
   interlayer insulating layers and conductive patterns that are alternately stacked in a vertical direction;
   first holes arranged in a first horizontal direction crossing the vertical direction and passing through the interlayer insulating layers and the conductive patterns;
   second holes arranged in the first horizontal direction and passing through the interlayer insulating layers and the conductive patterns;

channel structures that are arranged between the first holes and the second holes, the channel structures passing through the interlayer insulating layers and the conductive patterns; and vertical structures filling the first holes and the second holes, the vertical structures including protruding portions that protrude toward the adjacent conductive patterns.

2. The semiconductor device of claim 1, wherein the first holes and the second holes are arranged in a zigzag pattern.

3. A semiconductor device, comprising:

interlayer insulating layers and conductive patterns that are alternately stacked in a vertical direction;

first holes arranged in a first horizontal direction crossing the vertical direction and passing through the interlayer insulating layers and the conductive patterns;

second holes arranged in the first horizontal direction and passing through the interlayer insulating layers and the conductive patterns;

channel structures that are arranged between the first holes and the second holes, the channel structures passing through the interlayer insulating layers and the conductive patterns;

a sidewall insulating layer covering a sidewall of each of the first and second holes; and a conductive contact pillar filling each of the first and second holes and formed on the sidewall insulating layer.

4. The semiconductor device of claim 3, wherein the first holes and the second holes are arranged in a zigzag pattern.

* * * * *